(12) United States Patent
Dhillon et al.

(10) Patent No.: US 9,260,797 B2
(45) Date of Patent: Feb. 16, 2016

(54) SINGLE CRYSTAL CVD SYNTHETIC DIAMOND MATERIAL

(71) Applicant: Element Six Limited, Ballasalla (IM)

(72) Inventors: Harpreet Kaur Dhillon, Oxfordshire (GB); Daniel James Twitchen, Santa Clara, CA (US); Rizwan Uddin Ahmad Khan, Berkshire (GB)

(73) Assignee: Element Six Limited, Ballasalla (IM)

( * ) Notice: Subject to any disclaimer, the term of this patent is extended or adjusted under 35 U.S.C. 154(b) by 0 days.

(21) Appl. No.: 14/362,822

(22) PCT Filed: Dec. 12, 2012

(86) PCT No.: PCT/EP2012/075237
§ 371 (c)(1),
(2) Date: Jun. 4, 2014

(87) PCT Pub. No.: WO2013/087697
PCT Pub. Date: Jun. 20, 2013

(65) Prior Publication Data
US 2014/0335339 A1  Nov. 13, 2014

Related U.S. Application Data

(60) Provisional application No. 61/576,465, filed on Dec. 16, 2011.

(30) Foreign Application Priority Data

Dec. 16, 2011  (GB) .................................... 1121642.1

(51) Int. Cl.
*C30B 29/04* (2006.01)
*C30B 21/04* (2006.01)
*C30B 21/02* (2006.01)
*C30B 25/10* (2006.01)
*C30B 25/16* (2006.01)
*C30B 25/20* (2006.01)

(52) U.S. Cl.
CPC .................. *C30B 29/04* (2013.01); *C30B 21/02* (2013.01); *C30B 21/04* (2013.01); *C30B 25/10* (2013.01); *C30B 25/16* (2013.01); *C30B 25/20* (2013.01)

(58) Field of Classification Search
CPC .......... C30B 29/04; C30B 21/02; C30B 21/04
See application file for complete search history.

(56) References Cited

U.S. PATENT DOCUMENTS

| | | |
|---|---|---|
| 6,162,412 A | 12/2000 | Fujimori et al. |
| 7,157,067 B2 | 1/2007 | Hemley et al. |
| 7,820,131 B2 | 10/2010 | Hemley et al. |
| 7,883,684 B2 | 2/2011 | Hemley et al. |
| 7,910,083 B2 * | 3/2011 | Twitchen et al. ............. 423/446 |
| 8,758,509 B2 * | 6/2014 | Twitchen et al. ................ 117/86 |
| 2008/0311023 A1 * | 12/2008 | Yamamoto et al. ........... 423/446 |
| 2009/0038934 A1 | 2/2009 | Hemley et al. |
| 2010/0126406 A1 | 5/2010 | Yan et al. |
| 2011/0017126 A1 * | 1/2011 | Twitchen et al. ................ 117/88 |
| 2011/0151226 A1 | 6/2011 | Twitchen et al. |
| 2014/0356276 A1 * | 12/2014 | Godfried et al. ............. 423/446 |

FOREIGN PATENT DOCUMENTS

| | | |
|---|---|---|
| GB | 1476313 A | 6/1977 |
| GB | 2476478 A | 6/2011 |
| JP | 7277890 A | 10/1995 |
| JP | 2008/10891 A | 5/2008 |
| WO | 01/96633 A1 | 12/2001 |
| WO | 01/96634 A1 | 12/2001 |
| WO | 03/052174 A2 | 6/2003 |
| WO | 03/052177 A1 | 6/2003 |
| WO | 2004/022821 A1 | 3/2004 |
| WO | 2004/046427 A1 | 6/2004 |
| WO | 2005/061400 A1 | 7/2005 |
| WO | 2007/066215 A2 | 6/2007 |
| WO | 2010/010344 A1 | 1/2010 |
| WO | 2010/010352 A1 | 1/2010 |
| WO | 2010/149775 A1 | 12/2010 |
| WO | 2010/149777 A1 | 12/2010 |
| WO | 2010/149779 A1 | 12/2010 |
| WO | 2011/151415 A2 | 12/2011 |
| WO | 2012/084655 A2 | 6/2012 |

OTHER PUBLICATIONS

International Search Report for PCT/EP2012/075237 dated Apr. 25, 2013.
Search Report for GB1121642.1 dated Apr. 13, 2012.
Search Report for GB 1222318.6 dated Mar. 28, 2013.
Zhang, et al., "The effect of CO2 on the high-rate homoepitaxial growth of CVD single crystal diamonds," Diamond & Related Materials, 20, pp. 496-500, 2011.
Chayahara, et al., "The effect of nitrogen addition during high-rate homoepitaxial growth of diamond by microwave plasma CVD", Diamond & Related Materials, 13, pp. 1954-1958, 2004.
Mokuno, et al., "High rate homoepitaxial growth of diamond by microwave plasma CVD with nitrogen addition", Diamond & Related Materials 15, pp. 455-459, 2006.
Chayahara et al., "Development of single-crystalline diamond wafers", Synthesiology, vol. 3, No. 4, 259-267, 2010.
Butler, et al., "Understanding the chemical vapor deposition of diamond: recent progress", J. Phys. Condens. Matter 21, 364201, 2009.
Lawson et al., "On the existence of positively charged single-substitutional nitrogen in diamond", Journal of Physics: Condensed Matter 10, pp. 6171-6180, 1998.
Balmer, R.S., et al., "Chemical vapour deposition synthetic diamond: materials, technology and applications", Journal of Physics: Condensed Matter, vol. 21, No. 36, p. 364221, Aug. 19, 2009.

\* cited by examiner

*Primary Examiner* — Robert M Kunemund
(74) *Attorney, Agent, or Firm* — Dean W. Russell; Clark F. Weight; Kilpatrick Townsend & Stockton LLP

(57) ABSTRACT

A single crystal CVD synthetic diamond material comprising: a total as-grown nitrogen concentration equal to or greater than 5 ppm, and a uniform distribution of defects, wherein said uniform distribution of defects is defined by one or more of the following characteristics: (i) the total nitrogen concentration, when mapped by secondary ion mass spectrometry (SIMS) over an area equal to or greater than 50×50 μm using an analysis area of 10 μm or less, possesses a point-to-point variation of less than 30% of an average total nitrogen concentration value, or when mapped by SIMS over an area equal to or greater than 200×200 μm using an analysis area of 60 μm or less, possesses a point-to-point variation of less than 30% of an average total nitrogen concentration value; (ii) an as-grown nitrogen-vacancy defect (NV) concentration equal to or greater than 50 ppb as measured using 77K UV-visible absorption measurements, wherein the nitrogen-vacancy defects are uniformly distributed through the synthetic single crystal CVD diamond material such that, when excited using a 514 nm laser excitation source of spot size equal to or less than 10 μm at room temperature using a 50 mW continuous wave laser, and mapped over an area equal to or greater than 50×50 μm with a data interval less than 10 μm there is a low point-to-point variation wherein the intensity area ratio of nitrogen vacancy photoluminescence peaks between regions of high photoluminescent intensity and regions of low photolominescent intensity is <2× for either the 575 μm photoluminescent peak ($NV^0$) or the 637 nm photoluminescent peak (NV); (iii) a variation in Raman intensity such that, when excited using a 514 nm laser excitation source (resulting in a Raman peak at 552.4 nm) of spot size equal to or less than 10 μm at room temperature using a 50 mW continuous wave laser, and mapped over an area equal to or greater than 50×50 μm with a data interval less than 10 μm, there is a low point-to-point variation wherein the ratio of Raman peak areas between regions of low Raman intensity and high Raman intensity is <1.25×; (iv) an as-grown nitrogen-vacancy defect (NV) concentration equal to or greater than 50 ppb as measured using 77K UV-visible absorption measurements, wherein, when excited using a 514 nm excitation source of spot size equal to or less than 10 μm at 77K using a 50 mW continuous wave laser, gives an intensity at 575 nm corresponding to $NV^0$ greater than 120 times a Raman intensity at 552.4 nm, and/or an intensity at 637 nm corresponding to $NV^-$ greater than 200 times the Raman intensity at 552.4 nm; (v) a single substitutional nitrogen defect ($N_s$) concentration equal to or greater than 5 ppm, wherein the single substitutional nitrogen defects are uniformly distributed through the synthetic single crystal CVD diamond material such that by using a 1344 $cm^{-1}$ infrared absorption feature and sampling an area greater than an area of 0.5 $mm^2$, the variation is lower than 80%, as deduced by dividing the standard deviation by the mean value; (vi) a variation in red luminescence intensity, as defined by a standard deviation divided by a mean value, is less than 15%; (vii) a mean standard deviation in neutral single substitutional nitrogen concentration of less than 80%; and (viii) a color intensity as measured using a histogram from a microscopy image with a mean gray value of greater than 50, wherein the color intensity is uniform through the single crystal CVD synthetic diamond material such that the variation in gray color, as characterized by the gray value standard deviation divided by the gray value mean, is less than 40%.

21 Claims, 6 Drawing Sheets

SINGLE CRYSTAL CVD SYNTHETIC DIAMOND MATERIAL

FIELD OF INVENTION

Embodiments of the present invention relate to single crystal CVD (chemical vapour deposited) synthetic diamond material and methods of making the same.

BACKGROUND OF INVENTION

By way of background, a short introduction to diamond materials science is presented here in order to set the context for the present invention.

Diamond materials are based on a theoretically perfect diamond lattice. The properties that would be exhibited by this theoretically perfect lattice are well understood. For example, such a theoretically perfect diamond lattice would exhibit extremely high thermal conductivity, low electrical conductivity (very wide band gap intrinsic semi-conductor with no significant charge carriers but with high charge carrier mobility if charge carriers are introduced into the lattice structure), extremely low thermal expansion coefficient, no significant optical birefringence, and low optical absorption (no significant absorption in the visible spectrum so there would be no colour).

Such a theoretically perfect diamond lattice is thermodynamically impossible to attain. In reality, it is practically difficult to even approach a level of perfection which would be possible to achieve in theory when taking into account thermodynamic considerations. As such, it should be apparent that all diamond materials contain a significant number of defects. Such defects may come in the form of impurities. Typical impurities which may be incorporated into a diamond lattice structure include nitrogen, boron, silicon, phosphorous, hydrogen, and metals such as sodium, nickel, and chromium. Additionally, defects within diamond materials also include crystallographic deviations from the perfect diamond lattice structure in the form of point defects such as vacancies and interstitials and extended defects such as various forms of dislocation defects. Defects may also combine in various ways. For example, vacancy defects may combine into clusters or combine with impurity atoms to form unique vacancy structures with their own individual properties. Examples include silicon containing defects such as silicon-vacancy defects (Si—V), silicon di-vacancy defects (Si—$V_2$), silicon-vacancy-hydrogen defects (Si—V:H), silicon di-vacancy hydrogen defects (S—$V_2$:H) and nitrogen containing defects such as nitrogen-vacancy defects (N—V), di-nitrogen vacancy defects (N—V—N), and nitrogen-vacancy-hydrogen defects (N—V—H). These defects are typically found in a neutral charge state or in a charged state, e.g. negatively charged.

Defects within diamond materials significantly alter the properties of the materials. Ongoing work in this field is concerned with understanding the properties of the various defects within diamond materials and their overall effect on the functional properties of the materials. Furthermore, ongoing work is concerned with engineering diamond materials to have particular types and distributions of defects in order to tailor diamond materials to have particular desirable properties for particular applications. The types and distributions of defects which are desired will thus depend on the properties required for particular applications.

In this regard, diamond materials may be categorized into three main types: natural diamond materials; HPHT (high pressure high temperature) synthetic diamond materials, and CVD (chemical vapour deposited) synthetic diamond materials. These categories reflect the way in which the diamond materials are formed. Furthermore, these categories reflect the structural and functional characteristics of the materials. This is because while natural, HPHT synthetic, and CVD synthetic diamond materials are all based on a theoretically perfect diamond lattice the defects in these material are not the same. For example, CVD synthetic diamond contains many defects unique to the process of CVD, and whilst some defects are found in other diamond forms, their relative concentration and contribution is very different. As such, CVD synthetic diamond materials are different to both natural and HPHT synthetic diamond materials.

Diamond materials may also be categorized according to their physical form. In this regard, diamond materials may be categorized into three main types: single crystal diamond materials; polycrystalline diamond materials; and composite diamond materials. Single crystal diamond materials are in the form of individual single crystals of various sizes ranging from small "grit" particles used in abrasive applications through to large single crystals suitable for use in a variety of technical applications as well for gemstones in jewelry applications. Polycrystalline diamond materials are in the form a plurality of small diamond crystals bonded together by diamond-to-diamond bonding to form a polycrystalline body of diamond material such as a polycrystalline diamond wafer. Such polycrystalline diamond materials can be useful in various applications including thermal management substrates, optical windows, and mechanical applications. Composite diamond materials are generally in the form of a plurality of small diamond crystals bonded together by a non-diamond matrix to form a body of composite material. Various diamond composites are known including diamond containing metal matrix composites, particularly cobalt metal matrix composites known as PCD, and skeleton cemented diamond (ScD) which is a composite comprising silicon, silicon carbide, and diamond particles.

It should also be appreciated that within each of the aforementioned categories there is much scope for engineering diamond materials to have particular concentrations and distributions of defects in order to tailor diamond materials to have particular desirable properties for particular applications. In this regard, the present invention is concerned with CVD synthetic diamond materials to which the focus of this specification will now turn.

CVD processes for synthesis of diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, CVD synthetic diamond material can be deposited. Polycrystalline CVD diamond material may be formed on a non-diamond substrate such as a refractory metal or silicon substrate. Single crystal CVD synthetic diamond material may be formed by homoepitaxial growth on a single crystal diamond substrate.

Atomic hydrogen is essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD synthetic diamond growth including arc-jet, hot filament, DC arc, oxy-acetylene flame, and microwave plasma.

Impurities in the CVD process gases are incorporated into the CVD synthetic diamond material during growth. As such, various impurities may be intentionally introduced into the CVD process gases, or intentionally excluded from the CVD process gases, in order to engineer a CVD synthetic diamond material for a particular application. Furthermore, the nature of the substrate material and the growth conditions can affect the type and distribution of defects incorporated into the CVD synthetic diamond material during growth.

For certain applications it is desirable to minimize the number of defects, or at least certain types of defect, within the diamond lattice structure. For example, for certain electronic applications such as radiation detectors or semi-conductive switching devices it is desirable to minimize the number of charge carriers inherent in the diamond material and increase the mobility of charge carriers intentionally introduced into the material in use. Such a material may be engineered by fabricating a single crystal CVD synthetic diamond material which has a low concentration of impurities which would otherwise introduce charge carriers into the diamond lattice structure. Patent literature relevant to such electronic/detector grade single crystal CVD synthetic diamond material includes WO01/096633 and WO01/096634.

For certain optical applications it is desirable to provide a material which has low optical absorbance and low optical birefringence. Such a material may be engineered by fabricating a single crystal CVD synthetic diamond material which has a low concentration of impurities, which would otherwise increase the optical absorbance of the material, and a low concentration of extended defects which would otherwise introduce anisotropic strain into the diamond lattice structure causing birefringence. Patent literature relevant to such optical grade single crystal CVD synthetic diamond material includes WO2004/046427 and WO2007/066215.

High purity diamond material is also desirable to function as a host material for quantum spin defects in certain quantum sensing (e.g. in measuring magnetic fields) and processing applications Diamond materials are useful in such applications as certain quantum spin defects (e.g. the negatively charge nitrogen-vacancy defect) disposed within the diamond lattice structure have a long decoherence time even at room temperature (i.e. the quantum spin defects remain in a specific quantum spin state for a significant length of time allowing sensing and/or quantum processing applications to be performed). Furthermore, such quantum spin defects within the diamond lattice can be optically addressed. However, in such applications impurities can interact with quantum spin defects within the diamond lattice structure reducing their decoherence time and thus reducing their sensitivity and/or reducing the time during which quantum processing applications can be performed. Patent literature relevant to such high purity quantum grade single crystal CVD synthetic diamond material includes WO 2010010344 and WO 2010010352.

In contrast to the low defect materials described above, for certain applications it is desirable to intentionally introduce a significant but controlled quantity, type and distribution of defects into the diamond lattice structure. For example, introducing boron into the diamond lattice by providing a boron containing gas within the CVD process gases provides an acceptor level within the band structure of the diamond material thus forming a p-type semi-conductor. If extremely high levels of boron are introduced into the diamond lattice structure the material shows full metallic conductivity. Such materials are useful as electrodes, as electrochemical sensing electrodes, and in electronic applications. Patent literature relevant to such boron doped single crystal CVD synthetic diamond material includes WO03/052174.

Another example is the addition of nitrogen to high-pressure high-temperature (HPHT) synthetic diamond materials. It is well-known that high concentrations (hundreds of parts per million) of atomic nitrogen can be incorporated into HPHT synthetic diamond. However for several applications, HPHT-grown diamond possesses additional qualities that are detrimental. Growth tends to be highly non-uniform with a higher defect impurity (nitrogen as well as trace metals) in some sectors compared to others, and hence HPHT-grown diamond commonly exhibits colour zoning in both its as-grown and treated states. Non-uniformity along with stacking faults along the sector boundaries can also influence the fracture toughness of the material produced. Also, commonly present in HPHT-grown diamond material are metal inclusions, as a consequence of the solvent metal used as a catalyst in the HPHT growth process. These metal inclusions can strongly affect the mechanical properties of the material produced.

Another example, particularly pertinent to the present invention, is that of nitrogen doped single crystal CVD synthetic diamond materials. Nitrogen is one of the most important dopants in CVD diamond material synthesis as it has been found that providing nitrogen in the CVD process gas increases the growth rate of the material and can also affect the formation of crystallographic defects such as dislocations. As such, nitrogen doping of single crystal CVD synthetic diamond materials has been extensively investigated and reported in the literature. Nitrogen doped CVD synthetic diamond material tends to be brown in colour. As such, for the previously discussed applications, such as optical applications, it has been found to be advantageous to develop techniques which intentionally exclude nitrogen from the CVD process gases. However, for applications such as mechanical applications where optical, electronic, and quantum coupling parameters are not a concern, nitrogen doping to significant levels can be useful in achieving growth of thick layers of CVD synthetic diamond material. Patent literature relevant to such nitrogen doped single crystal CVD synthetic diamond material includes WO2003/052177 which describes a method of fabricating diamond material using a CVD synthesis atmosphere comprising nitrogen in a concentration range 0.5 to 500 ppm, calculated as molecular nitrogen.

Nitrogen doped single crystal CVD synthetic diamond material has also been found to be a useful starting material for post-growth treatments such as irradiation and/or annealing to achieve desirable colours. For example, WO2004/022821 describes an annealing technique which may be applied to yellow/brown nitrogen doped single crystal CVD synthetic diamond material to achieve desirable colours such as pinks, greens, colourless and near colourless. Such treated single crystal CVD synthetic diamond material may have jewelry applications as gem stones. Further irradiation and annealing techniques for converting nitrogen containing single crystal CVD synthetic diamond material into desirable colours are described in WO 2010149777 (to produce orange single crystal CVD synthetic diamond material), WO 2010149775 (to produce light pink single crystal CVD synthetic diamond material), and WO 2010149779 (to produce light blue single crystal CVD synthetic diamond material). These treatments involve single crystal CVD synthetic diamond materials having various levels of single substitutional nitrogen, single substitutional vacancy defects (neutral and negatively charged), and nitrogen-vacancy defects. The defect centres that cause colour commonly luminesce as well, and therefore the post-growth treatment of diamond in this way allows the engineering of luminescent centres which may be used for e.g. diamond-based dyes.

In addition to the above, US2011/0151226 describes that there is a need for a single crystal CVD synthetic diamond material with a relatively high nitrogen content that is uniformly distributed and which is free of other defects, such as inclusions, normally associated with HPHT synthesis processes. In this regard, US2011/0151226 describes a CVD growth process which uses a CVD process gas including nitrogen and oxygen containing gases in addition to the standard carbon and hydrogen containing gases. These process gases are included at certain specified ratios to obtain CVD synthetic diamond material with both a high concentration of nitrogen in the form of single substitutional nitrogen and a low concentration of other defects. It is described that such a growth chemistry is advantageous for producing material having a colour which is not dominated by brown defects but is instead dominated by a yellow hue due to the presence of single substitutional nitrogen. It is further described that the electronic properties of the material are dominated by single substitutional nitrogen, but not degraded by the other defects normally resulting from nitrogen in the growth process and that the material may be used for gem applications and for technical applications such as in electronics and radiation detectors.

US2011/0151226 uses a CVD synthesis atmosphere containing nitrogen at an atomic concentration in a range 0.4 ppm to 50 ppm. Furthermore, it is described that for the duration of the synthesis process the substrate on which the single crystal CVD synthetic diamond material is grown is maintained at a temperature in the range 750° C. to 1000° C. It is described that this process is capable of synthesizing CVD diamond material comprising single substitutional nitrogen ($N_s^0$) at a concentration of greater than about 0.5 ppm and having a total integrated absorption in the visible range from 350 nm to 750 nm such that at least about 35% of the absorption is attributable to $N_s^0$.

Zhang et al., Diamond & Related Materials, 20, 496-500 (2011) also disclose a CVD growth process using a process gas which includes nitrogen and oxygen containing gases in addition to hydrogen and carbon containing species. The described process utilizes a substrate temperature of 1000° C. It is taught that the addition of $CO_2$ can actually reduce the concentration of nitrogen incorporation into the CVD synthetic diamond material.

In addition to the above, a number of additional prior art documents discuss various CVD diamond synthesis processes which utilize one or more of nitrogen process gas, high substrate temperature, and oxygen process gas. These are briefly discussed below.

U.S. Pat. No. 7,883,684 discloses a CVD diamond synthesis method which uses a synthesis atmosphere comprising 8% to 20% $CH_4$ per unit of $H_2$ and 5% to 25% $O_2$ per unit of $CH_4$. It is also described that the gas mix can optionally include 0.2% to 3% $N_2$ per unit of $CH_4$. It is stated that the addition of $N_2$ to the gas mix at this concentration creates more available growth sites, enhances the growth rate, and promotes {100} face growth. It is further described that the method includes controlling the temperature of a growth surface of the growing single crystal CVD synthetic diamond material at a growth temperature in the range 700° C. to 1100° C. For the examples which utilize nitrogen it is stated that the resultant single crystal CVD synthetic diamond material is brown in colour and that the colour of the material can be changed by annealing.

U.S. Pat. No. 7,820,131 discloses a CVD diamond synthesis method which uses a synthesis atmosphere comprising 8% to in excess of 30% $CH_4$ per unit of $H_2$ and optionally 5% to 25% $O_2$ per unit of $CH_4$ to produce a colourless single crystal CVD synthetic diamond material. It is also described that a gas mix which comprises nitrogen rather than oxygen results in a single crystal CVD synthetic diamond material which is brown in colour. It is further described that the method includes controlling the temperature of a growth surface of the growing single crystal CVD synthetic diamond material at a growth temperature in the range 900° C. to 1400° C.

US2010/0126406 also discloses a CVD diamond synthesis method which uses a synthesis atmosphere comprising hydrogen, a carbon source, and an oxygen source. Two alternative embodiments are described: (i) a process in which the synthesis atmosphere is essentially free of nitrogen resulting in the growth of colourless single crystal CVD synthetic diamond material; and (ii) a process in which the synthesis atmosphere includes a small amount of nitrogen resulting in the growth of brown single crystal CVD synthetic diamond material.

U.S. Pat. No. 7,157,067 discloses a CVD diamond synthesis method which uses a synthesis atmosphere comprising hydrogen, a carbon source, and nitrogen with a $N_2/CH_4$ ratio of 0.2% to 5.0% and a $CH_4/H_2$ ratio of 12% to 20%. It is described that by using such a synthesis atmosphere and controlling the temperature of a growth surface of the growing single crystal CVD synthetic diamond material at a growth temperature in the range 1000° C. to 1100° C. it is possible to produce single crystal CVD synthetic diamond material with increased fracture toughness.

US2009/0038934 discloses a CVD diamond synthesis method which uses a synthesis atmosphere which includes oxygen. It is further described that optionally the synthesis atmosphere comprises hydrogen, methane at a concentration of 6% to 12% per unit of hydrogen, nitrogen at a concentration of 1% to 5% per unit of hydrogen, and oxygen at a concentration of 1% to 3% per unit of hydrogen. It is further described that the temperature of a growth surface of the growing single crystal CVD synthetic diamond material is controlled at a growth temperature in the range 900° C. to 1400° C.

JP2008110891 discloses a CVD diamond synthesis method which uses a synthesis atmosphere comprising atomic concentrations of carbon to hydrogen of 2% to 10%, nitrogen to carbon of 0.1% to 6%, and oxygen to carbon of 0.1% to 5%.

JP7277890 discloses a CVD diamond synthesis method which uses a synthesis atmosphere comprising hydrogen, carbon, nitrogen and optionally oxygen or boron. It is further disclosed that diamond having 3-1,000 ppm ratio of the number of nitrogen atoms to that of hydrogen atoms or 3-100% ratio of the number of oxygen atoms to that of carbon atoms is synthesized. It is described that since a very small amount of nitrogen is added as gaseous starting material, high quality diamond is synthesized at an increased rate of synthesis.

U.S. Pat. No. 6,162,412 discloses a CVD diamond synthesis method which uses a synthesis atmosphere in which a concentration of carbon atoms in relation to hydrogen gas (A %), a concentration of nitrogen gas in relation to the whole reaction gas (B ppm) and a concentration of oxygen atoms in relation to the hydrogen gas (C %) satisfies the equation: $\alpha=(B)^{1/2}\times(A-1.2C)$, provided that $\alpha$ is not larger than 13 or B is not larger than 20. The examples indicate that the substrate was held at a temperature of 950° C. during CVD diamond growth. It is further stated that the synthesized CVD diamond material contains 20 ppm or less of nitrogen.

Chayahara et al. "The effect of nitrogen addition during high-rate homoepitaxial growth of diamond by microwave plasma CVD" Diamond & Related Materials 13, 1954-1958 (2004) discloses a CVD diamond synthesis method which uses a synthesis atmosphere comprising 500 sccm hydrogen, 40 sccm methane, and nitrogen from 0 to 3 sccm. Two different substrate temps are disclosed—1220° C. for an open type substrate holder and 1155° C. for an enclosed type holder. It is described that nitrogen increases growth rate and alters the surface morphology of the CVD synthetic diamond material.

Mokuno et al. "High rate homoepitaxial growth of diamond by microwave plasma CVD with nitrogen addition" Diamond & related Materials 15, 455 to 459 (2006) discloses a CVD diamond synthesis method which uses a synthesis atmosphere comprising 500 sccm hydrogen, 60 sccm methane, and nitrogen from 0.6 to 1.8 sccm. As in the previously discussed paper two different substrate holders were used, one being an open type holder and one being a closed type holder. Substrate temperatures in a range 1060° C. to 1250° C. are disclosed. It is reported that nitrogen concentrations in the CVD synthetic diamond materials formed using these process parameters range from 8.9 to 39 ppm.

Chayahara et al. "Development of single-crystalline diamond wafers" Synthesiology, vol. 3, no. 4, 259-267 (2011) discloses a similar CVD diamond synthesis method which uses a synthesis atmosphere comprising 500 sccm hydrogen, 60 sccm methane, and nitrogen from 0 to 3 sccm with substrate temperatures in a range 1100° C. to 1200° C.

In light of the above, it is evident that the prior art relating to nitrogen doping in CVD diamond synthesis process is reasonably extensive. In the context of this prior art, the present inventors have investigated routes to achieve high levels of nitrogen incorporation into CVD synthetic diamond materials. As such, the present inventors have been particularly interested in 'high' nitrogen gas fraction/'high' substrate temperature CVD diamond synthesis processes, 'high' being defined as substantially greater than 'standard' diamond growth that takes place at 700-950° C. with nitrogen gas fractions of, for example, less than 20 ppm of the gas mix. The present inventors have found that high nitrogen gas fraction/high substrate temperature growth conditions allow substantially greater concentrations of single substitutional nitrogen defects ($N_s$) to be incorporated into the CVD synthetic diamond material (e.g. 5 to 50 ppm) than standard growth conditions, along with a significant concentration of as-grown nitrogen-vacancy defects (e.g. approximately 100 ppb). Such material is useful for a range of applications including certain quantum sensing and processing applications, optical filters, mechanical tool pieces, and as a starting material for post-growth irradiation and/or annealing treatments to form coloured gemstones. In relation to quantum sensing and processing applications, it was previously described that high purity diamond material is desirable for such applications in order to achieve long decoherence times. However, for certain quantum sensing applications, such as magnetometry, sensitivity is related to the product of the density of $NV^-$ defects and the decoherence times of these defects. In such circumstances, it can be desirable to provide a large concentration of $NV^-$ centres for certain applications even if the decoherence time is somewhat compromised.

Nitrogen-vacancy defects can be formed by irradiated CVD synthetic diamond material which contains single substitutional nitrogen defects to form vacancy defects and annealing the material to migrate the vacancies to pair up with single substitutional nitrogen defects in order to achieve the nitrogen-vacancy defects. Alternatively, under certain growth conditions it has been found that a significant number of nitrogen vacancy defects can be formed directly during growth and these "as-grown" nitrogen-vacancy defects have some advantages over those formed by post-growth irradiation and annealing. For example, as-grown nitrogen-vacancy defects can be preferentially aligned relative to the growth direction of the CVD synthetic diamond material and this preferential alignment can increase the sensitivity of the quantum spin defects in terms of both magnitude and directional sensitivity. Furthermore, due to the fact that no irradiation has been required in order to form the nitrogen-vacancy defects, damage to the diamond lattice may be minimized, and the formation of other defect types that are generated as a consequence of irradiation and/or annealing (e.g. monovacancies and divacancies) which result in a further detriment to the quantum optical properties of the material can be eliminated.

In addition to the presence of nitrogen-vacancy defects, electron donor species are required to convert the neutral defects into negatively charged defects suitable for certain quantum spin defect applications. In this regard, single substitutional nitrogen defects normally functional as electron donating species. As such, a layer of CVD synthetic diamond material containing a high concentration of single substitutional nitrogen and a substantial concentration of nitrogen-vacancy defects may be useful in that the single substitutional nitrogen can donate charge to the nitrogen-vacancy defects to form $NV^-$ defects suitable for quantum sensing and processing applications.

One problem with the aforementioned single layer structure is that the single substitutional nitrogen defects can interact with the nitrogen-vacancy defects reducing their decoherence time as previously described. Accordingly, it can be advantageous to provide two separate layers, one containing a large number of single substitutional nitrogen defects so as to function as an electron donating layer and a further layer containing quantum spin defects which can accept negative charge to switch on the quantum spin defects for sensing and processing applications. In this case, the electron donor layer may be provided by using a high nitrogen/high substrate temperature CVD diamond synthesis process.

For optical filter applications, a high concentration of certain nitrogen containing defects having specific optical absorption characteristics can be used to filter light in a controlled manner. Alternatively, for mechanical tool piece applications it has been postulated that high concentrations of certain nitrogen containing defects can improve the wear and/or toughness characteristics of the CVD synthetic diamond material. Further still, as previous described a CVD synthetic diamond material having high concentrations of certain nitrogen containing defects can be used as a starting material for post-growth irradiation and/or annealing treatments to form coloured gemstones. Another potential application of such high nitrogen CVD synthetic diamond material is in lasing applications.

However, the present inventors have identified a problem with such high nitrogen/high substrate temperature CVD diamond synthesis processes. Specifically, the present inventors have found that CVD synthetic diamond material fabricated using such processes is striated under photoluminescent conditions (e.g. using a DiamondView™ imaging technique) due to a non-uniform distribution of nitrogen defects. The striations and non-uniform nitrogen distribution remain even if the CVD synthetic diamond material is subjected to multiple post-growth treatments such high pressure high temperature processing and successive irradiation and annealing treatments.

This is problematic for quantum sensing and processing applications which utilize nitrogen-vacancy quantum spin defects as a non-uniform distribution of nitrogen-vacancy defects within the material results in the material having variable sensitivity. Furthermore, if the material is to be used as a charge donating layer in such applications as previously described a non-uniform distribution of single substitutional nitrogen can result in non-uniform charge donation to another layer comprising quantum spin defects such that the concentration of negatively charged quantum spin defects is non-uniform. Again this results in variable sensitivity.

A non-uniform nitrogen distribution is also problematic for the other applications previously mentioned. For example, in optical filter applications a non-uniform distribution of nitrogen defects will result in non-uniform optical filtering. Similarly, for mechanical tool piece applications a non-uniform distribution of nitrogen defects can result in non-uniform wear and/or toughness characteristics. Furthermore, for gemstone applications a non-uniform distribution of nitrogen defects will result in non-uniform colour thus reducing the quality of the gemstone.

In light of the above, it is an aim of embodiments of the present invention to provide a CVD diamond synthesis process which is capable of forming CVD synthetic diamond material which has both a high and uniform distribution of nitrogen defects. Certain embodiments aim to provide a CVD synthetic diamond material which has both a high and uniform distribution of single substitutional nitrogen defects. Alternatively, or additionally, certain embodiments aim to provide a CVD synthetic diamond material which has both a high and uniform distribution of nitrogen vacancy defects. Alternatively, or additionally, certain embodiments aim to provide a CVD synthetic diamond material which has substantially no visible striations under photoluminescent conditions (e.g. using a DiamondView™ imaging technique).

SUMMARY OF INVENTION

According to a first aspect of the present invention there is provided a single crystal CVD synthetic diamond material comprising:
  a total as-grown nitrogen concentration equal to or greater than 5 ppm, and
  a uniform distribution of defects, wherein said uniform distribution of defects is defined by one or more of the following characteristics:
  (i) the total nitrogen concentration, when mapped by secondary ion mass spectrometry (SIMS) over an area equal to or greater than 50×50 µm using an analysis area of 10 µm or less, possesses a point-to-point variation of less than 30% of an average total nitrogen concentration value, or when mapped by SIMS over an area equal to or greater than 200×200 µm using an analysis area of 60 µm or less, possesses a point-to-point variation of less than 30% of an average total nitrogen concentration value;
  (ii) an as-grown nitrogen-vacancy defect (NV) concentration equal to or greater than 50 ppb as measured using 77K UV-visible absorption measurements, wherein the nitrogen-vacancy defects are uniformly distributed through the synthetic single crystal CVD diamond material such that, when excited using a 514 nm laser excitation source of spot size equal to or less than 10 µm at room temperature using a 50 mW continuous wave laser, and mapped over an area equal to or greater than 50×50 µm with a data interval less than 10 µm, there is a low point-to-point variation wherein the intensity area ratio of nitrogen vacancy photoluminescence peaks between regions of high photoluminescent intensity and regions of low photolominescent intensity is <2× for either the 575 nm photoluminescent peak ($NV^0$) or the 637 nm photoluminescent peak (NV);
  (iii) a variation in Raman intensity such that, when excited using a 514 nm laser excitation source (resulting in a Raman peak at 552.4 nm) of spot size equal to or less than 10 µm at room temperature using a 50 mW continuous wave laser, and mapped over an area equal to or greater than 50×50 µm with a data interval less than 10 µm, there is a low point-to-point variation wherein the ratio of Raman peak areas between regions of low Raman intensity and high Raman intensity is <1.25×;
  (iv) an as-grown nitrogen-vacancy defect (NV) concentration equal to or greater than 50 ppb as measured using 77K UV-visible absorption measurements, wherein, when excited using a 514 nm excitation source of spot size equal to or less than 10 µm at 77K using a 50 mW continuous wave laser, gives an intensity at 575 nm corresponding to $NV^0$ greater than 120 times a Raman intensity at 552.4 nm, and/or an intensity at 637 nm corresponding to $NV^-$ greater than 200 times the Raman intensity at 552.4 nm;
  (v) a single substitutional nitrogen defect ($N_s$) concentration equal to or greater than 5 ppm, wherein the single substitutional nitrogen defects are uniformly distributed through the synthetic single crystal CVD diamond material such that by using a 1344 $cm^{-1}$ infrared absorption feature and sampling an area greater than an area of 0.5 $mm^2$, the variation is lower than 80%, as deduced by dividing the standard deviation by the mean value;
  (vi) a variation in red luminescence intensity, as defined by a standard deviation divided by a mean value, is less than 15%;
  (vii) a mean standard deviation in neutral single substitutional nitrogen concentration of less than 80%; and
  (viii) a colour intensity as measured using a histogram from a microscopy image with a mean gray value of greater than 50, wherein the colour intensity is uniform through the single crystal CVD synthetic diamond material such that the variation in gray colour, as characterised by the gray value standard deviation divided by the gray value mean, is less than 40%.

Preferably, the single crystal CVD synthetic diamond material comprises two, three, four, five, six, seven, or all eight of the aforementioned characteristics.

Optionally, the single crystal CVD synthetic diamond material comprises one or more of:
  a total nitrogen concentration is equal to or greater than 7 ppm, 10 ppm, 15 ppm, 20 ppm, 30 ppm, 50 ppm, 75 ppm, 100 ppm, 150 ppm, 200 ppm, or 300 ppm;
  a single substitutional nitrogen defect ($N_s$) concentration is equal to or greater than 7 ppm, 10 ppm, 15 ppm, 20 ppm, 30 ppm, 50 ppm, 75 ppm, 100 ppm, 150 ppm, 200 ppm, or 300 ppm; and
  an as-grown nitrogen-vacancy defect ($NV^-$) concentration is equal to or greater than 120 ppb, 140 ppb, 160 ppb, 180 ppb, 200 ppb, 250 ppb, 300 ppb, 400 ppb, 500 ppb, 1000 ppb, or 5000 ppb.

The single crystal CVD synthetic diamond material preferably also has low concentrations of impurities (other than nitrogen). For example, the material may have a concentration of silicon equal to or less than $1 \times 10^{15}$ atoms cm$^{-3}$. The material also preferably is fabricated to have low crystallographic defects. For example, the material may have a dislocation bundle density equal to or less than: $10^6$ dislocations cm$^{-2}$; $10^4$ dislocations cm$^{-2}$; $3 \times 10^3$ dislocations cm$^{-2}$; $10^3$ dislocations cm$^{-2}$; $10^2$ dislocations cm$^{-2}$; or 10 dislocations cm$^{-2}$. Such material has good optical quality. For example, the material may have a birefringence equal to or less than $5 \times 10^{-5}$, $1 \times 10^{-5}$, $5 \times 10^{-6}$, or $1 \times 10^{-6}$;

For certain applications, it is desirable to fabricate large pieces of the material as described herein. For example, the single crystal CVD synthetic diamond material may have one or more of:
- a longest dimensions equal to or greater than 200 μm, 500 μm, 1 mm, 1.5 mm, 2.0 mm, 3.0 mm, or 5.0 mm;
- a volume equal to or greater than 0.01 mm$^3$, 0.05 mm$^3$, 0.1 mm$^3$, 0.5 mm$^3$, 1.0 mm$^3$, 3.0 mm$^3$, 6.0 mm$^3$, 9.0 mm$^3$, or 15.0 mm$^3$ though which the previously described one or more characteristics hold true; and
- a layer thickness greater than 200 μm, 500 μm, 1 mm, 1.5 mm, 2.0 mm, 3.0 mm, or 5.0 mm.

For certain other applications such as certain quantum sensing and processing applications it can be desirable to form very thin layers of such material. For example, the single crystal CVD synthetic diamond material may be in the form of a layer having a thickness less than 200 μm, 100 μm, 50 μm, 20 μm, 10 μm, 5 μm, 2 μm, or 1 μm.

The single crystal CVD synthetic diamond material may also be annealed and/or irradiated. For example, the material can be annealed and/or irradiated to form a variety of colours including pink, yellow, green, orange, red, and purple.

According to a second aspect of the present invention there is provided a method of fabricating a single crystal CVD diamond material as previously defined, the method comprising:
- forming a CVD synthesis atmosphere comprising hydrogen, a carbon source gas, a nitrogen source gas, and optionally an oxygen source gas, wherein the CVD synthesis atmosphere comprises an atomic concentration of nitrogen relative to a total gas composition in a range 0.1% to 3%, 0.1% to 2%, 0.1% to 1%, or 0.2% to 0.8%;
- growing single crystal CVD diamond material on a single crystal diamond substrate mounted on a support substrate; and
- controlling the temperature of the support substrate such that temperature variations across the support substrate at any given point in the growth process are less than 50° C., 40° C., 30° C., 20° C., 10° C., or 5° C. of a target temperature value, temperature variations throughout the growth run are less then 50° C., 40° C., 30° C., 20° C., 10° C., or 5° C. of the target temperature value, and the target temperature value lies in a range 1000° C. to 1400° C.,
- wherein the CVD synthesis atmosphere comprises at least one of:
- an atomic concentration of carbon relative to the total gas composition in a range 0.1% to 2.0%, 0.3% to 1.7%, 0.5% to 1.5%, 0.7% to 1.3%, or 0.8% to 1.2%; and
- an atomic concentration of oxygen relative to the total gas composition in a range 5% to 40%, 10% to 30%, 10% to 25%, or 15% to 20%.

For CVD synthesis atmospheres comprising a low atomic concentration of carbon, for example equal to or less than 0.8%, no oxygen source gas is required.

Optionally, the single crystal diamond substrate is mounted to the support substrate by a braze alloy.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

The physics/chemistry of CVD synthetic diamond growth is documented extensively in the literature, see e.g. Butler et al., J. Phys Condens. Matter 21 (2009) 364201 (20 pp). A general atomic picture of CVD synthetic diamond growth suggests that it occurs due to several processes: (i) the generation of atomic hydrogen and methyl radicals within the plasma; (ii) the formation of active carbon radical sites on the diamond surface normally via surface reactions between the hydrogen radical and surface hydrogen-terminated diamond surface; (iii) the addition of a methyl radical on the surface radical site thus forming a methyl adatom that initiates the new layer; and (iv) surface diffusion of the methyl adatom via hopping to neighbouring radical sites. All of these processes can be influenced by the growth conditions.

In high nitrogen/high substrate temperature growth, the concentration of reactive (radical) atoms on the diamond surface is increased, because of two reasons. First, high temperatures are sufficient to thermally dissociate a small fraction of atomic hydrogen from the diamond surface leaving behind surface radical carbon atoms. Secondly, the presence of a greater nitrogen concentration within a few atomic layers of the growing diamond surface may also weaken surface C—H bonds also resulting in more surface radical sites, because nitrogen can donate its lone electron pair to the surface sites thus increasing their reactivity.

Figure 1:
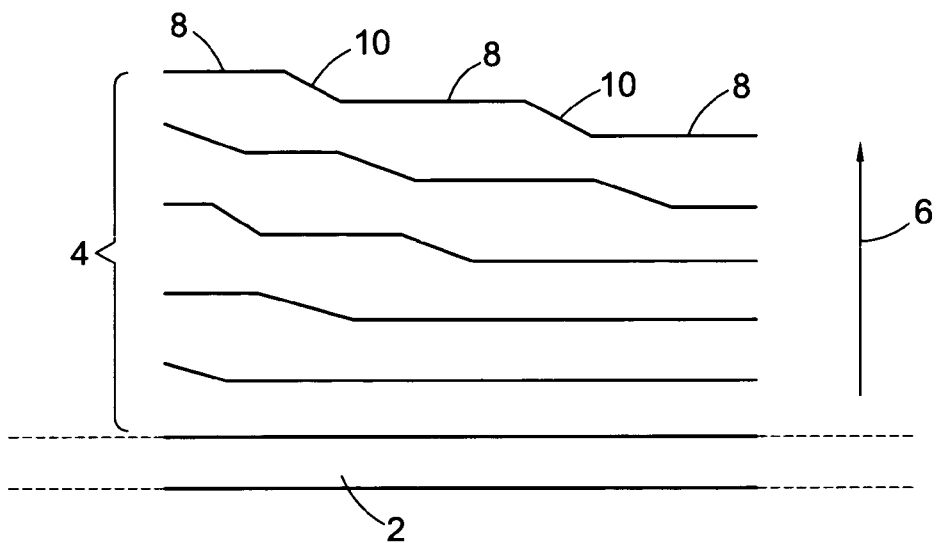
FIG. 1 illustrates step flow growth of single crystal CVD synthetic diamond material under high nitrogen/high substrate temperature conditions.

The growth surface of nitrogen-doped CVD synthetic diamond shows sequences of growth steps with terrace regions separated by inclined risers. Such step flow growth is shown in FIG. 1 which illustrates a single crystal diamond substrate 2 on which single crystal CVD diamond material 4 is grown. The growth direction is illustrated by arrow 6. The sequence of lines illustrates the morphology of the growth surface of the single crystal CVD diamond material 4 during various stages of growth. As can be seen, the growth surface develops a series of terrace regions 8 separated by inclined risers 10. It has been found that high nitrogen/high substrate temperature growth can lead to the formation of particularly coarse/large steps.

When examining a cross-section luminescence image of a CVD synthetic diamond sample (e.g. using the well-known DiamondView™ analysis tool), one observes a distribution of nitrogen-vacancy luminescence in a striated pattern, these striations corresponding to regions of high and low impurity density. These striations are particularly notable for high nitrogen/high substrate temperature growth. The spacing between the striations corresponds with the spacing between the steps on the growth surface. While not being bound by theory it is thus believed that the striations are caused by differential uptake of impurity-related defects on the risers and terraces of surface steps with defect incorporation on the risers of the steps (angled with respect to the growth surface) being greater than that on the terraces of the steps (parallel with respect to the growth surface).

In light of the above, the present inventors have realized that one way to solve the problem of striations in a high nitrogen/high substrate temperature growth process for single crystal CVD synthetic diamond material would be to develop a technique which reduces non-uniform uptake of impurities as described above. In this regard, it has been found to be possible to tailor the composition of the CVD synthesis atmosphere to reduce or substantially eliminate non-uniform nitrogen uptake in a high nitrogen/high substrate temperature growth process for single crystal CVD synthetic diamond material. Specifically, the present inventors have found that more uniform high nitrogen/high substrate temperature growth can be achieved by adding a large quantity of oxygen into the CVD synthesis atmosphere and/or significantly reducing the quantity of carbon source gas in the CVD synthesis atmosphere. Thus, it has been found that the synthesis method may comprise:

forming a CVD synthesis atmosphere comprising hydrogen, a carbon source gas, a nitrogen source gas, and optionally an oxygen source gas, wherein the CVD synthesis atmosphere comprises an atomic concentration of nitrogen relative to a total gas composition in a range 0.1% to 3%, 0.1% to 2%, 0.1% to 1%, or 0.2% to 0.8%; and growing single crystal CVD diamond material on a single crystal diamond substrate mounted on a support substrate;

wherein the CVD synthesis atmosphere comprises at least one of:

an atomic concentration of carbon relative to the total gas composition in a range 0.1% to 2.0%, 0.3% to 1.7%, 0.5% to 1.5%, 0.7% to 1.3%, or 0.8% to 1.2%; and an atomic concentration of oxygen relative to the total gas composition in a range 5% to 40%, 10% to 30%, 10% to 25%, or 15% to 20%.

In light of the above, it is evident that a high nitrogen/high substrate temperature growth process for single crystal CVD synthetic diamond material may be adapted by altering the chemistry of the CVD synthesis gas such that the process contains a large quantity of oxygen and/or a significantly reduced carbon source gas content. However, this in itself is not considered sufficient to solve the problems of non-uniform nitrogen defect uptake during CVD diamond growth under high nitrogen/high substrate temperature conditions. Even if the growth chemistry is altered as previously described, non-uniform uptake of nitrogen can still occur due to temperature variations at the growth surface which affect the rate of nitrogen uptake. These temperature variations can be in a lateral direction relative to the growth direction at a particular point in the growth run (spatially distributed) or parallel to the growth direction due to variations in temperature over the duration of a growth run (temporally distributed). Such temperature variations resulting in non-uniform uptake of nitrogen are particularly problematic under high nitrogen/high substrate temperature conditions. Effective thermal management is difficult for growth at these high temperatures, and this becomes even more important when trying to grow uniform material using high nitrogen levels.

Accordingly, in addition to the provision of a particular CVD growth chemistry as previously described, it is also important to provide an effective thermal management configuration for precisely controlling the temperature across the growth surface of CVD diamond material both: (i) in a lateral direction to avoid lateral non-uniformities in nitrogen uptake at any one point in time during a growth run; and (ii) throughout the growth run to avoid vertical non-uniformities in nitrogen uptake as the growth run progresses.

A number of different features may contribute to the provision of an effective thermal management configuration including one or more of: (i) good thermal contact between the single crystal diamond substrate on which the CVD synthetic diamond material is to be grown and an underlying support substrate; (ii) an underlying support substrate which has high thermal conductivity and which can function as an effective heat sink to remove thermal energy from the single crystal CVD synthetic diamond material being grown and which is capable of maintaining uniform temperatures across the surface of the support substrate on which one or more single crystal diamond substrates are mounted; (iii) a temperature control system which can quickly and reproducibly change the temperature of the support substrate and thus quickly and reproducibly account for any variations in the temperature of the single crystal CVD synthetic diamond material being grown due to the provision of a good thermal contact between the single crystal CVD synthetic diamond material and the underlying support substrate as specified in point (i); and (iv) a temperature monitoring system which can measure the temperature of the single crystal CVD synthetic diamond material being grown (or the underlying single crystal diamond substrate or support substrate if these are all provided in good thermal contact) in a reproducible manner such that any temperature variations can be detected and the temperature control system used to counteract such variations. Configurations meeting requirements (i) to (iv) are discussed below.

Figure 2:
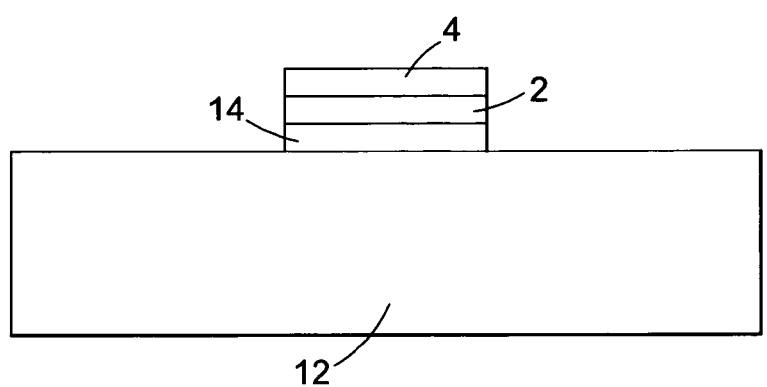
FIG. 2 illustrates a substrate composition in which a single crystal diamond substrate is bonded to an underlying refractory metal support substrate via a selected high temperature braze alloy which provides good thermal contact between single crystal CVD synthetic diamond material being grown on the single crystal diamond substrate and the underlying refractory metal substrate allowing precise control of the temperature across the growth surface of the single crystal CVD diamond material during the synthesis process.

FIG. 2 illustrates a substrate configuration in which a single crystal diamond substrate 2 is bonded to an underlying support substrate 12 via a selected high temperature braze alloy 14 which provides good thermal contact between the single crystal CVD synthetic diamond material 4 being grown on the single crystal diamond substrate 2 and the underlying support substrate 12 allowing precise control of the temperature across the growth surface of the single crystal CVD synthetic diamond material 4 during the synthesis process.

Brazing of single crystal diamond substrates to a support substrate such as a refractory metal carrier has previously been disclosed. The typical braze used is a Au/Ta thin foil and works well up to growth temperatures of 900° C. However, for growth under high nitrogen/high substrate temperature conditions at temperatures in a range 1000° C. to 1400° C. it was previously thought that such a braze join would fail. Surprisingly, it has been found that the Au/Ta braze can be used above its melting point. Although the braze tends to melt in a temperature range 1000° C. to 1200° C., it has been found that the braze remains sufficiently coherent to hold the overlying single crystal diamond substrate in place and polycrystalline diamond material growing around the periphery of the single crystal diamond substrate can aid in holding the single crystal diamond substrate in place if a carbide forming refractory metal support substrate is utilized. Accordingly, the single crystal diamond substrate can be mounted to the support substrate by a braze alloy having a melting point less than the target temperature for growing single crystal CVD diamond material on the single crystal diamond substrate such that the braze alloy is in a liquid state during growth of the single crystal CVD diamond material. This type of brazing can be utilized with embodiments of the present invention and can also be used in other single crystal CVD synthetic diamond growth processes.

Alternatively, for higher temperatures if a brazing method is to be used as the route to thermal management and diamond substrate bonding an alternative braze that has a very high melting point may be used to ensure consistent and reliable bonding. The present inventors have tested a number of different types of braze powder compositions with the aim of reaching growth temperatures of greater than 1400° C. These include: (i) 8% Pd, 87% Au, 5% Ti or 11% Pd, 84% Au, 5% Ti, both of which are suitable up to a growth temperature of approximately 1100° C.; (ii) 12.5% Pd, 82.5% Au, 5% Ti which is suitable up to a growth temperature of 1250° C.; and 14% Pd, 81% Au, 5% Ti which is suitable up to a growth temperature greater than 1400° C. The selected braze will thus depend on the growth temperature which is used in the high nitrogen/high substrate temperature CVD process. For example, for growth temperatures in a range 1150° C.-1200° C. a suitable braze is provided by the composition 12.5% Pd, 82.5% Au, 5% Ti. Of course, slight variations from these specific compositions are possible. It is also noted that this is not an exhaustive list and other high temperature braze compositions and materials (e.g. foil) may be suitable for implementing the present invention.

The braze compositions are primarily available in powder form and may be mixed with a binder to create a paste having a suitable consistency to achieve a good bond between the single crystal diamond substrate and the support substrate.

In light of the above discussion it will be appreciated that the braze alloy may have one or more of the following characteristics:
  a melting point equal to or greater than 1000° C., 1100° C., 1200° C., 1300° C., or 1400° C.;
  a composition comprising one or more of gold, tantalum, palladium, and/or titanium;
  at least 8%, 10%, 12% or 14% palladium;
  70 to 90% gold, 8 to 20% palladium and 1 to 15% tantalum and/or titanium.

As previously described, the support substrate should have a high thermal conductivity, function as an effective heat sink to remove thermal energy from the single crystal CVD synthetic diamond material being grown, and be capable of maintaining uniform temperatures across the surface of the support substrate on which one or more single crystal diamond substrates are mounted. In this regard, it has been found to be advantageous to provide a support substrate comprising a cylindrical disc of a refractory metal having a flat upper surface and a flat lower surface The cylindrical disc may have a diameter of 80 mm or more. Furthermore, the upper and lower surface may have a flatness variation no more than 100 µm. In this regard, it has been found that the flatness of the support substrate surfaces can affect the temperature of the diamond being support on the support substrate during CVD growth. As such, it has been surprisingly found that the support substrate must be processed to a very high degree of flatness in order to avoid temperature variations across the substrate. The reasons for this relate to the interaction of the substrate temperature control system with the support substrate and are discussed in more detail later.

Figure 3:
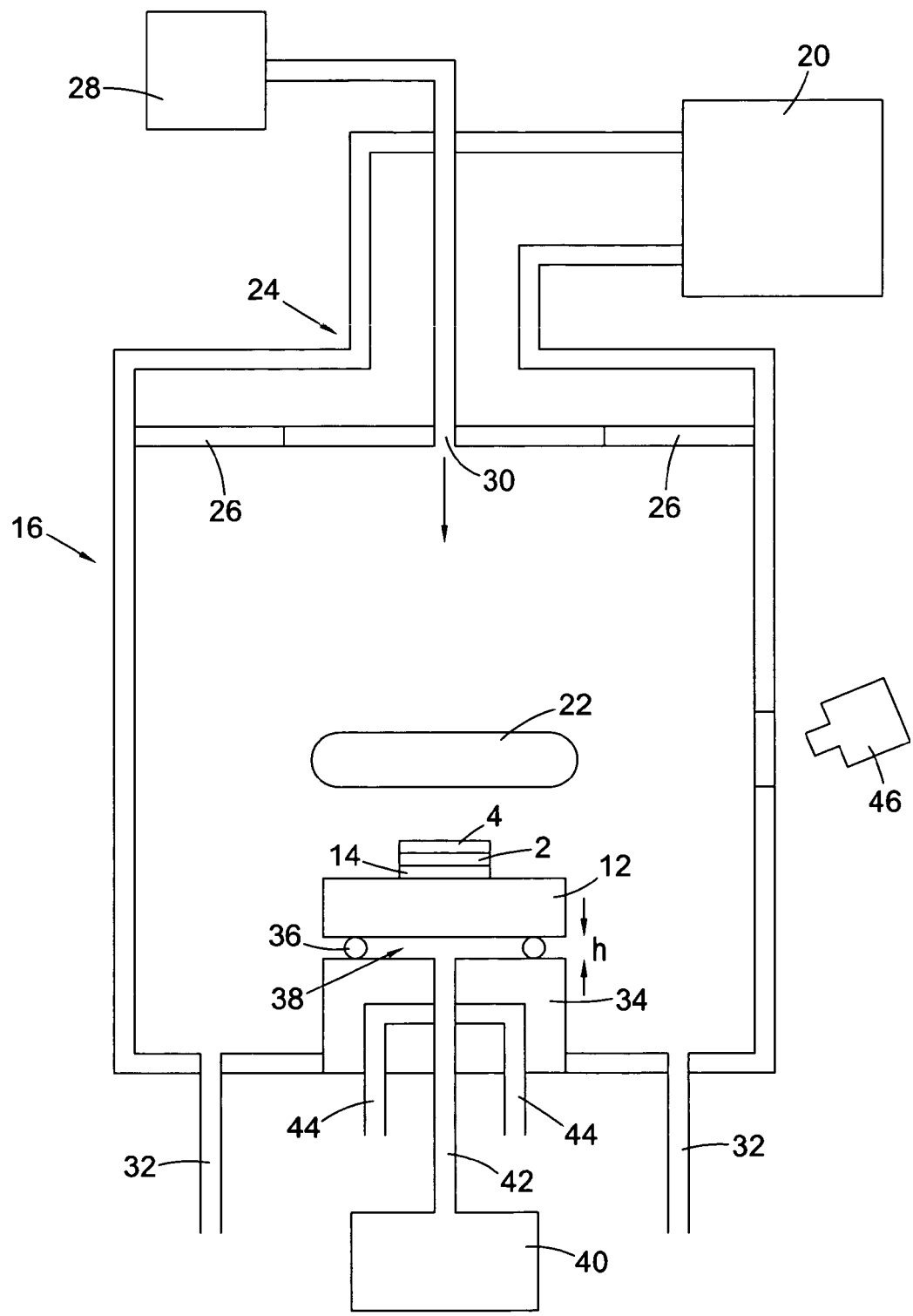
FIG. 3 illustrates a microwave plasma reactor for synthesis of CVD diamond material which comprises a substrate mounting stage and temperature control system used in combination with a substrate composition as illustrated in FIG. 2 for achieving precise control of the temperature across the growth surface of the single crystal CVD diamond material during the synthesis process.

FIG. 3 shows an example of a microwave plasma reactor comprising a temperature monitoring system and substrate temperature control system. The microwave plasma reactor comprises the following basic components: a plasma chamber 16; a substrate holder 18; a substrate configuration 2, 12, 14 as previous illustrated in FIG. 2 on which CVD synthetic diamond material 4 is grown; a microwave generator 20 for forming a plasma 22 within the plasma chamber 16; a microwave coupling configuration 24 for feeding microwaves from the microwave generator 20 into the plasma chamber 16 via dielectric windows 26; and a gas flow system comprising source gases 28, one or more gas inlets 30, and one or more gas outlets 32 for feeding process gases into the plasma chamber 16 and removing them therefrom.

The plasma chamber is configured to form a resonance cavity supporting a standing microwave in use. According to one configuration the plasma chamber is configured to support a $TM_{01n}$ standing microwave in use, e.g. a $TM_{011}$ mode. The operational frequency may be in a range 400 to 500 MHz, 800 to 1000 MHz, or 2300 to 2600 MHz. Source gases including a carbon source and molecular hydrogen are fed into the plasma reactor vessel and can be activated by the standing microwave field to form a plasma in high electric field regions. The substrate configuration is provided in close proximity to the plasma such that reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

The support substrate 12 is spaced apart from a substrate holder 34 by spacer wires or spacer pads 36 to define a gas gap 38 between a supporting surface of the substrate holder 34 and a rear surface of the support substrate 12. The height h of the gas gap may be in the range 25 μm to 2000 μm, 50 μm to 1000 μm, or 100 μm to 750 μm depending on the specific synthesis conditions. Such gas gaps can be used with a support substrate having a diameter of 120 mm for example. For high temperature diamond synthesis processes a gas gap height in the range 500 μm to 750 μm or 600 μm to 650 μm has been found to be preferred. This contrasts with lower temperature diamond synthesis processes in which a gas gap height in the range 100 μm to 300 μm or 150 μm to 250 μm is preferred. Furthermore a gas supply system 40 is coupled to the gas gap 38 via a supply pipe 42 which extends from the gas supply system 40 through the substrate holder 34 and is configured to supply gas into the gas gap 38 through one or more outlets in the supporting surface of the substrate holder 34. A coolant liquid supply system 44 is also provided for cooling the substrate holder 34.

Figure 5:
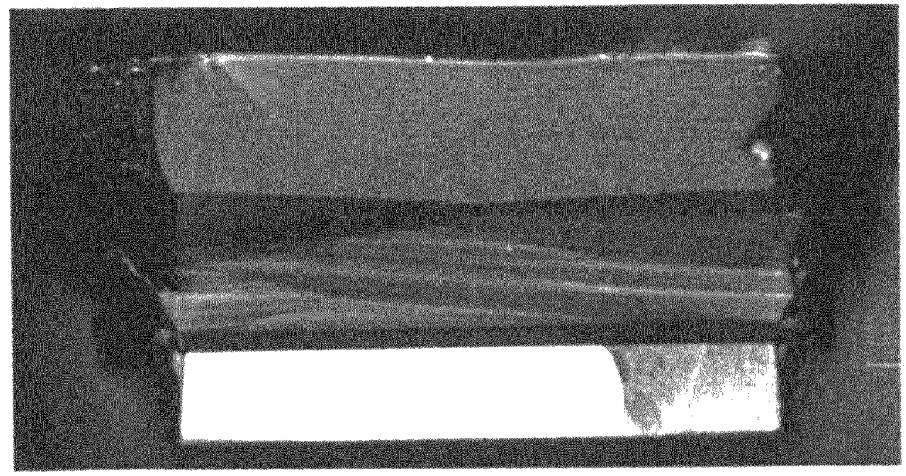
FIG. 5 is a DiamondView™ image of a single crystal CVD synthetic diamond material comprising two layers including a first layer showing clearly visible striations which was grown under high nitrogen/high substrate temperature conditions and a second layer showing substantially no visible striations which was formed by adding a large concentration of oxygen to the synthesis atmosphere.

It should also be noted that while the microwave plasma reactor illustrated in FIG. 5 has a separate substrate holder 34 disposed in the plasma chamber, the substrate holder may be formed by the base of the plasma chamber 16. The use of the term "substrate holder" is intended to cover such variations. Furthermore, the substrate holder may comprise a flat supporting surface which is the same diameter (as illustrated) or larger than the support substrate 12. For example, the substrate holder may form a large flat surface, formed by the chamber base or a separate component disposed over the chamber base, and the substrate may be carefully positioned on a central region of the flat supporting surface. In one arrangement, the flat supporting surface may have further elements, for example projections or grooves, to align, and optionally hold, the support substrate. Alternatively, no such additional elements may be provided such that the substrate holder merely provides a flat supporting surface over which the support substrate is disposed.

The coolant liquid supply system 44 provides a rough basic cooling to the substrate holder 34. However, this system has been found to be insufficiently precise for the fine temperature control of the substrate which is considered to be required by the present inventors in order to obtain uniform nitrogen uptake in CVD synthetic diamond material grown over large support substrates. Accordingly, the gas supply system 40, 42 is provided in order to allow more precise control of the support substrate temperature. The gas supply system 40, 42 may be configured to inject at least two gases having different thermal conductivities into the gas gap below the support substrate 12 and vary a ratio of the at least two gases in order to control the temperature of the support substrate on the substrate holder. For example, the gas supply system may utilize a mixture of a light gas such as hydrogen and a heavy gas such as argon which is less thermally conductive. Advantageously, the gases used to control the temperature of the substrate are ones which are also utilized in the main process chemistry so that additional gas sources are not required. If an edge temperature of the support substrate is too high relative to a central region of the support substrate, the proportion of heavy gas relative to light gas can be increased to reduce the thermal conductivity of the gas under a central region of the support substrate, thus causing the central region of the support substrate to heat up relative to the edge of the support substrate. Conversely, if the edge temperature of the support substrate is too low relative to the central region of the support substrate, the proportion of light gas relative to heavy gas can be increased to increase the thermal conductivity of the gas under a central region of the support substrate, thus causing the central region of the support substrate to cool down relative to the edge of the support substrate. The absolute temperature of the support substrate as well as the relative temperature of different regions of the support substrate can also be controlled by varying gas flow and gas composition within the gas gap under the support substrate.

The spacer wires 36 may be configured to define a central gas gap cavity under the substrate so that the gas pools in the central gas gap cavity. The spacer wires may each be arcuate in shape and configured into a ring with gaps between which the gas can flow. The spacer elements may be electrically conductive and/or may be fixed in place with an electrically conductive adhesive such as Silver DAG™ which has been found to be useful in ensuring a good electrical contact between the spacer elements and the substrate holder. This aids in preventing the problem of arcing under the support substrate which can detrimentally affect temperature control.

The microwave plasma reactor further comprises one or more temperature measurement devices 46 configured to take at least two temperature measurements, including one or more measurements in a central region of the support substrate and one or more measurements in a peripheral region of the support substrate. The temperature measurements may be taken simultaneously or within a short time interval of each other and the substrate temperature control system may be used to correct any temperature variations. The temperature measurement device may comprise a pyrometer 46 as illustrated in FIG. 3. Two pyrometers may be provided, one to take the central temperature measurements and one to take the peripheral temperature measurements. Alternatively, a plurality of thermocouples can be embedded into the substrate. That said, embedding thermocouples has been found to be difficult and can be unreliable. As such, a plurality of pyrometry measurements is considered to be the better solution. In this regard, pyrometric measurements may focus on the temperature of the growing CVD synthetic diamond material. However, as the material is in good thermal contact with the underlying support substrate then the temperature of the diamond material will be approximately the same as the temperature of the underlying support substrate. For single crystal CVD synthetic diamond growth in which a plurality of single crystal diamond substrates are provided on the support substrate, the temperature measurements may thus be taken between the growing CVD single crystals.

Even when utilizing arrangements such as those described above, a number of problems may still exist, although these may be substantially alleviated by the previously described arrangements. For example, in some instances there may still be issues of non-uniform CVD synthetic diamond growth and non-uniform uptake of nitrogen across the support substrate area, particularly when growing a plurality of single crystal diamond crystals in a single growth run on a plurality of single crystal diamond substrates adhered to a support substrate over a relatively large area (e.g. 80 mm diameter or more). This is particularly problematic as there is an on going need to increase the area over which high quality, uniform CVD synthetic diamond can be grown. Furthermore, these problems tend to be exacerbated when the support substrates are reused in subsequent growth runs. This is particularly problematic for refractory metal substrates which are expensive and reuse is desirable in an economically competitive industrial process.

It has been surprisingly found that the aforementioned problems are a result of small variations in temperature across the top surface of the support substrate caused by very minor variations in the height of the gas gap under the support substrate. In particular, the present inventors found that although the cylindrical refractory metal support substrates provided by their supplier have nominally planar front and rear surfaces, these surfaces are not sufficiently flat. Minor flatness variations in a rear surface of the support substrate result in minor variations in the height of the gas gap and it has been found that this results in differential cooling across the support substrate.

While the previously described arrangements can control variations in temperature which are circumferentially symmetric, it can be more difficult to control temperature variations which are not circumferentially symmetric such as those caused by variations in the gas gap height. For example, refractory metal support substrates tend to sag and buckle during use (despite being a long way from their melting point). Uniform sag mainly modifies the edge to centre temperature profile which can be controlled as previously described. However, buckling introduces non-uniformities in the temperature of the support substrate which are not symmetric. Typical buckling magnitudes can be greater than 20 micron (peak to valley).

In order to solve this problem, the present inventors found that it is advantageous to ensure that the height h of the gas gap varies by no more than 200 µm, 150 µm, 100 µm, 80 µm, 60 µm, 40 µm, 20 µm, 10 µm, or 5 µm. This may be achieved, for example, by further processing the rear surface of support substrates provided by suppliers to have a very precisely defined profile which is complementary to the profile of the supporting surface of the substrate holder. For example, if the supporting surface of the substrate holder is flat, then the rear surface of the support substrate should be processed to ensure that it is very precisely flat.

Accordingly, control of rear surface support substrate shape by mechanical means (preferably uniform, non-directional processing, e.g. lapping rather than grinding) has been found to be advantageous. Furthermore, the supporting surface of the substrate holder may also be processed to have a precisely defined profile which is complementary to the rear surface of the substrate. Most conveniently this is flat, although other shapes can be used so long as the profile of the supporting surface of the substrate holder and the rear surface of the support substrate are complementary so as to maintain a very precisely defined gas gap height. Furthermore, it is possible to intentionally profile at least a portion of the supporting surface of the substrate holder or the rear surface of the support substrate to provide a controlled variation in the height of the gas gap, for example to have a smaller gas gap around the periphery of the support substrate to preferentially cool the peripheral region and/or to provide electric field modifying structures. Accordingly, the height h of the gas gap may vary by no more than 200 µm, 150 µm 100 µm, 80 µm, 60 µm, 40 µm, 20 µm, 10 µm, or 5 µm across at least a central region of the support substrate having a centred diameter equal to or greater than 60%, 70%, 80%, 90%, 95%, or 99% of a total diameter of the support substrate. Furthermore, the gas gap may have a central region with a first gas gap height and a peripheral region with a second gas gap height, the first gas gap height being larger than the second gas gap height.

The aforementioned discussion also explains why problems of non-uniform CVD synthetic diamond growth and nitrogen uptake are exacerbated by re-use of support substrates. The substrate can buckle during a CVD synthetic diamond growth run and therefore lose flatness. As such, it has been found to be advantageous to re-process the support substrate between uses to regain the desired surface profile. As the thickness of the substrate will be reduced by such reprocessing, the substrate holder height may be varied to ensure that in subsequent growth runs the growth surface of the substrate remains at an optimum height.

Similarly, the supporting surface of the substrate holder may also be re-processed between growth runs to maintain the desired profile, although it has been found that buckling of this surface is less of a problem than variations forming in the support substrate. To enable the supporting surface of the substrate holder to be readily re-processed it is desirable to configure the chamber design such that the substrate holder can readily be removable, measured to determine flatness of the supporting surface, re-processed if necessary to maintain supporting surface flatness, and replaced in the plasma chamber.

In light of the above, one method for reusing the same support substrate for a number of synthetic diamond growth runs involves adjusting a height of the support substrate within the reactor, when necessary, between synthetic diamond growth runs to account for material removed from the support substrate and/or substrate holder by reprocessing and maintain a substantially constant height of the growth surface during subsequent synthetic diamond growth runs. The height of the growth surface may be maintained within 2 mm, 1 mm, 0.8 mm, 0.5 mm, 0.3 mm, or 0.2 mm of a target height for the growth surface of the support substrate within the reactor. This method may be used to extend the life of support substrates which get reprocessed between runs, and therefore become thinner, while maintaining the growth surface at an optimum height for CVD synthetic diamond growth within the reactor as previously discussed. The height of the growth surface may be adjusted by providing a substrate holder which is adjustable in height. Alternatively, if a fixed height substrate holder is used, once the support substrate thickness has gone below a thickness tolerance band as defined numerically above, the substrate holder can be changed to one with a step matching the diameter of the support substrate to take the growth surface height back into its tolerance band. Alternatively, an adjustable height substrate holder may be provided.

In light of the above, it has been found that the support substrate should be processed to have surfaces with a very high degree of flatness in order to avoid temperature variations leading to non-uniform nitrogen uptake during CVD synthetic diamond growth. Such a support substrate may be formed from a refractory metal selected from, for example, one of molybdenum, tungsten, niobium, or alloys thereof.

According to embodiments of the present invention the flatness variation of the front and rear surfaces of the support substrate may be as low as possible. For example, the flatness variation of the surfaces may be no more than 75 µm, 50 µm, 40 µm, 30 µm, 20 µm, 10 µm, 5 µm, or 1 µm. Of course, while no flatness variations would be ideal, some very minor variations will still usually exist depending on the limits of the surface processing techniques used to remove flatness variations and the processing time required to achieve a better flatness which will have cost implications in an industrial process. Accordingly, a lower limit for the flatness variations of 0.001 µm or 0.01 µm may be applied.

The support substrate may have a diameter selected to be in the range: 165 mm to 415 mm, 185 mm to 375 mm, 205 mm to 375 mm, 205 mm to 330 mm, or 240 mm to 330 mm for a microwave frequency f in the range 400 to 500 MHz; 80 mm to 200 mm, 90 mm to 180 mm, 100 mm to 180 mm, 100 mm to 160, or 115 mm to 160 mm for a microwave frequency f in the range 800 to 1000 MHz; or 30 mm to 75 mm, 33 mm to 65 mm, 37 mm to 65 mm, 37 mm to 58 mm, or 42 mm to 58 mm for a microwave frequency f in the range 2300 to 2600 MHz. Utilizing embodiments of the present invention CVD synthetic diamond material can be successfully grown over support substrates falling within these ranges while retaining uniform growth and nitrogen uptake. It should be noted that by "cylindrical disc", we also intend to include discs which are approximately cylindrical, e.g. having a cross section within a circularity of ±10 mm, 5 mm, or 1 mm of a mean circumference. We also intend to include edge modifications such as chamfered edges and grooves as well as cutting errors.

Optionally, for a microwave plasma reactor with an operating frequency of 400 to 500 MHz, the cylindrical disc may have a depth in a range 10 mm to 30 mm or 15 mm to 25 mm. Alternatively, for a microwave plasma reactor with an operating frequency in the range 800 to 1000 MHz, the cylindrical disc may have a depth in a range 5 mm to 15 mm or 7 mm to 13 mm. Alternatively still, for a microwave plasma reactor with an operating frequency of 2300 to 2600 MHz, the cylindrical disc may have a depth in a range 2.0 mm to 5.5 mm or 2.5 mm to 4.5 mm. The depth of the support substrate has been found to be important as the CVD synthetic diamond growth process is very sensitive to the height of the growth surface. Furthermore, the depth of the substrate should be sufficiently large to function as an effective heat sink.

For single crystal diamond growth where single crystal diamond substrates are mounted on the refractory metal substrate prior to deposition, a surface roughness of 100 nm to 500 nm may be provided prior to attachment of the single crystal substrates and subsequent CVD growth thereon. The surface roughness, flatness and temperature of an underlying metallic substrate on which single crystal diamond substrates are mounted is important, despite the fact that the single crystal CVD synthetic diamond material grows on the single crystal diamond substrates rather than directly onto the underlying metallic substrate which supports the single crystal diamond substrates. This is because during single crystal diamond growth, polycrystalline diamond material grows over the underlying supporting substrate between the single crystals. If this polycrystalline diamond material delaminates during CVD synthetic diamond growth then the growth run can be disrupted. Furthermore, if this polycrystalline diamond material cracks on cooling this can lead to cracking of the single crystal diamond material embedded therein. As such, issues relating to growth of polycrystalline wafers can also apply to growth of single crystal material. In this regard, when we talk about a support substrate and a support substrate growth surface in the context of the present invention we mean the underlying substrate rather than single crystal substrates which are mounted thereon for single crystal CVD synthetic diamond growth. This underlying support substrate is sometimes known as a substrate carrier because it carriers further single crystal diamond substrates thereon. Furthermore, when we talk about the temperature of the growth surface of the support substrate we mean the temperature of the growth surface of the refractory metal substrate rather than the temperature of the growth surface of the single crystal diamond substrates (although these temperatures may be approximately the same if good thermal contact between the two is achieved using a braze join as described herein).

Typically, the refractory metal discs are first lapped on a cast iron wheel using diamond grit suspended in a lapping fluid. In general, the lapping process is used for bulk material removal and also to achieve the required flatness for the given process. There are a few processes where the as-lapped surface is used. A typical $R_a$ value for the lapped finish is 100 nm to 500 nm. However, the lapped surface may then be further processed as required using, for example, a grinding/polishing machine and using a finer grit to obtain a lower surface roughness value. Prior to CVD synthetic diamond growth, the refractory metal support substrates may be cleaned to ensure all contamination from the lapping process has been removed.

A substrate configuration as described above has been found to be advantageous for use in a method of manufacturing CVD synthetic diamond material via chemical vapour deposition, particularly in methods which utilize a microwave plasma reactor. However, in principle the substrate configuration could also be used in other types of CVD diamond reactor. Temperature variations across the support substrate can be controlled to be less than 50° C., 40° C., 30° C., 20° C., 10° C., or 5° C. Furthermore, temperature variations across a single crystal diamond substrate can be controlled to be less than 50° C., 40° C., 30° C., 20° C., 10° C., or 5° C.

Embodiments of the present invention thus combine effective thermal management in combination with a selected growth chemistry in order to fabricate more uniform single crystal CVD synthetic diamond material using a high nitrogen/high substrate temperature growth process. The method comprises:

forming a CVD synthesis atmosphere comprising hydrogen, a carbon source gas, a nitrogen source gas, and optionally an oxygen source gas, wherein the CVD synthesis atmosphere comprises an atomic concentration of nitrogen relative to a total gas composition in a range 0.1% to 3%, 0.1% to 2%, 0.1% to 1%, or 0.2% to 0.8%;

growing single crystal CVD diamond material on a single crystal diamond substrate mounted on a support substrate; and controlling the temperature of the support substrate such that temperature variations across the support substrate at any given point in the growth process are less than 50° C., 40° C., 30° C., 20° C., 10° C., or 5° C. of a target temperature value, temperature variations throughout the growth run are less then 50° C., 40° C., 30° C., 20° C., 10° C., or 5° C. of the target temperature value, and the target temperature value lies in a range 1000° C. to 1400° C., wherein the CVD synthesis atmosphere comprises at least one of:

an atomic concentration of carbon relative to the total gas composition in a range 0.1% to 2.0%, 0.3% to 1.7%, 0.5% to 1.5%, 0.7% to 1.3%, or 0.8% to 1.2%; and an atomic concentration of oxygen relative to the total gas composition in a range 5% to 40%, 10% to 30%, 10% to 25%, or 15% to 20%.

Using the previously described configurations, embodiments of the present invention may thus provide the following features:

(i) Effective thermal management using, for example, a high-temperature braze to adhere the single crystal diamond substrates to a support substrate, a well processed refractory metal support substrate, and suitable temperature monitoring and control systems. This results in more uniform temperature gradients across each single crystal CVD synthetic diamond and across a plurality of single crystal CVD synthetic diamond crystals mounted on the support substrate. The high temperature braze mounting method provides an effective, simple, and cost-effective method of providing good thermal contact between the growing single crystal CVD synthetic diamond material and the support substrate.

(ii) A modified high nitrogen/high substrate temperature synthesis chemistry using either of: (a) addition of high oxygen concentrations into the gas phase (for example, introduced as $O_2$, $CO_2$ or CO); or (b) lowering carbon source gas concentration (for example, introduced as $CH_4$). Both of these modifications can inhibit non-uniform dopant/impurity uptake.

By providing the combination of a modified thermal management configuration and a modified synthesis chemistry it is possible to achieve a combination of reduced differential impurity uptake due to growth steps and reduced differential impurity uptake due to temperature variations. By achieving such a combination of features it has been found to be possible to synthesise single crystal CVD diamond material having the following features:

(i) High and uniform total nitrogen defect distributions.
(ii) High and uniform distributions of $N_s$.
(iii) High and uniform distributions of NV.
(iv) No striations.
(v) Product uniformity over a single CVD synthetic diamond stone, over a plurality of CVD synthetic diamond stones grown within a single growth run, and from growth run to growth run.

The resultant single crystal CVD synthetic diamond material comprises:

a total as-grown nitrogen concentration equal to or greater than 5 ppm, 7 ppm, 10 ppm, 15 ppm, 20 ppm, 30 ppm, 50 ppm, 75 ppm, 100 ppm, 150 ppm, 200 ppm, or 300 ppm, and a uniform distribution of defects, wherein said uniform distribution of defects is defined by one or more of the following characteristics:

(i) the total nitrogen concentration, when mapped by secondary ion mass spectrometry (SIMS) over an area equal to or greater than 50×50 µm using an analysis area of 10 µm or less, possesses a point-to-point variation of less than 30%, 25%, 20%, 15%, 10%, 5%, 3%, or 1% of an average total nitrogen concentration value, or when mapped by SIMS over an area equal to or greater than 200×200 µm using an analysis area of 60 µm or less, possesses a point-to-point variation of less than 30%, 25%, 20%, 15%, 10%, 5%, 3%, or 1% of an average total nitrogen concentration value;

(ii) an as-grown nitrogen-vacancy defect (NV) concentration equal to or greater than 50 ppb as measured using 77K UV-visible absorption measurements, wherein the nitrogen-vacancy defects are uniformly distributed through the synthetic single crystal CVD diamond material such that, when excited using a 514 nm laser excitation source of spot size equal to or less than 10 µm at room temperature using a 50 mW continuous wave laser, and mapped over an area equal to or greater than 50×50 µm with a data interval less than 10 µm, there is a low point-to-point variation wherein the intensity ratio of nitrogen vacancy photoluminescence peaks between regions of high photoluminescent intensity and regions of low photoluminescent intensity is less than 2.0, 1.8, 1.6, 1.4, or 1.2 for either the 575 nm photoluminescent peak ($NV^0$) or the 637 nm photoluminescent peak ($NV^-$);

(iii) an as-grown nitrogen-vacancy defect (NV) concentration equal to or greater than 50 ppb as measured using 77K UV-visible absorption measurements, wherein, when excited using a 514 nm excitation source of spot size equal to or less than 10 µm at 77K using a 50 mW continuous wave laser, gives an intensity at 575 nm corresponding to $NV^0$ greater than 120, 140, 160, or 180 times a Raman intensity at 552.4 nm, and/or an intensity at 637 nm corresponding to $NV^-$ greater than 200, 220, 240, or 260 times the Raman intensity at 552.4 nm;

(iv) a single substitutional nitrogen defect ($N_s$) concentration equal to or greater than 5 ppm, wherein the single substitutional nitrogen defects are uniformly distributed through the synthetic single crystal CVD diamond material such that by using a 1344 $cm^{-1}$ infrared absorption feature and sampling an area greater than an area of 0.5 $mm^2$, the variation is lower than 80%, 60%, 40%, 20%, or 10%, as deduced by dividing the standard deviation by the mean value;

(v) a variation in red luminescence intensity, as defined by a standard deviation divided by a mean value, is less than 15%, 10%, 8%, 6%, or 4%;

(vi) a mean standard deviation in neutral single substitutional nitrogen concentration of less than 80%, 60%, 40%, 20%, or 10%; and (vii) a colour intensity as measured using a histogram from a microscopy image with a mean gray value of greater than 50, wherein the colour intensity is uniform through the single crystal CVD synthetic diamond material such that the variation in gray colour, as characterised by the gray value standard deviation divided by the gray value mean, is less than 40%, 30%, 20%, 10%, or 5% (for example as measured over volume equal to or greater than 200×200×200 µm with a point-to-point variation as specified).

The single crystal CVD synthetic diamond material may comprise two, three, four, five, six or all seven of said characteristics.

The single substitutional nitrogen defect ($N_s$) concentration may be equal to or greater than 5 ppm, 7 ppm, 10 ppm, 15 ppm, 20 ppm, 30 ppm, 50 ppm, 75 ppm, 100 ppm, 150 ppm, 200 ppm, or 300 ppm.

The as-grown nitrogen-vacancy defect ($NV^-$) concentration may be equal to or greater than 50 ppb, 75 ppb, 100 ppb, 120 ppb, 140 ppb, 160 ppb, 180 ppb, 200 ppb, 250 ppb, 300 ppb, 400 ppb, 500 ppb, 1000 ppb, or 5000 ppb.

The single crystal CVD synthetic diamond material may have a concentration of silicon equal to or less than $1 \times 10^{15}$ atoms $cm^{-3}$. A low silicon material may be fabricated using the CVD reactor design as described herein which does not comprise a quart bell-jar or large quartz windows. Such quartz components can lead to silicon contamination of the single crystal CVD synthetic diamond material during growth.

The single crystal CVD synthetic diamond material may have one or more of the following dimensional characteristics:

a longest dimensions equal to or greater than 200 µm, 500 µm, 1 mm, 1.5 mm, 2.0 mm, 3.0 mm, or 5.0 mm over which one or more of the previously described characteristics hold true;

a volume equal to or greater than 0.01 $mm^3$, 0.05 $mm^3$, 0.1 $mm^3$, 0.5 $mm^3$, 1.0 $mm^3$, 3.0 $mm^3$, 6.0 $mm^3$, 9.0 $mm^3$, or 15.0 $mm^3$ though which one or more of the previously described characteristics hold true;

a layer thickness less than 200 µm, 100 µm, 50 µm, 20 µm, 10 µm, 5 µm, 2 µm, or 1 µm or greater than 200 µm, 500 µm, 1 mm, 1.5 mm, 2.0 mm, 3.0 mm, or 5.0 mm though which one or more of the previously described characteristics hold true.

Preferably, the single crystal CVD synthetic diamond material also has a dislocation bundle density equal to or less than: $10^6$ dislocations $cm^{-2}$; $10^4$ dislocations $cm^{-2}$; $3\times10^3$ dislocations $cm^{-2}$; $10^3$ dislocations $cm^{-2}$; $10^2$ dislocations $cm^{-2}$; or 10 dislocations $cm^{-2}$ and/or a birefringence equal to or less than $5\times10^{-5}$, $1\times10^{-5}$, $5\times10^{-6}$, or $1\times10^{-6}$. Such material can be fabricating by ensuring that the single crystal substrates are carefully selected and processed to provide a growth surface which is substantially free of crystal defects prior to growth thereon.

The single crystal CVD synthetic diamond material may be as-grown material or may be material which is annealed and/or irradiated. The single crystal CVD synthetic diamond material may have one or more of the following colours: pink, yellow, green, orange, red, purple.

The commercial advantages of providing one or more of the aforementioned features include:
 (i) Material which has a more uniform quantum sensing and processing capabilities.
 (ii) Material which has more uniform optical absorbance for optical filtering applications.
 (iii) Material which has more uniform wear characteristics for mechanical applications.
 (iii) Material which has more uniform colour which is suitable for post-growth irradiation and/or annealing treatments to form high quality coloured gemstones.
 (iv) High growth rates (e.g. greater than 30 µm/hr).

It should also be noted that if the CVD synthetic diamond material is subjected to a post-growth annealing treatment the nitrogen defects can aggregate to form various types of aggregated nitrogen defects. However, a high level of uniformity in the nitrogen distribution is retained such that the colour of the material remains uniform and little or no striation features are visible under photoluminescent viewing conditions.

As well as other factors such as reduced metal impurities etc, the high uniformity of standard (i.e. lower nitrogen, lower temperature) CVD synthetic diamond material is normally its key advantage when compared to HPHT synthetics. For example CVD synthetics do not posses a plurality of growth sectors. One disadvantage of the CVD method is that it is more difficult to incorporate high levels of nitrogen during the growth process when compared to HPHT growth processes. Embodiments of the present invention address this issue and achieve high levels of nitrogen incorporation while also achieving more uniform nitrogen incorporation when compared to HPHT growth processes and other CVD growth processes which utilize a high nitrogen/high substrate temperature process.

EXAMPLES

Utilizing the previously described CVD reactor and substrate configuration, single crystal CVD diamond material has been grown under high nitrogen/high substrate temperature conditions using various concentration of oxygen containing source gas and various concentrations of carbon source gas in the CVD synthesis atmosphere.

Figure 4:
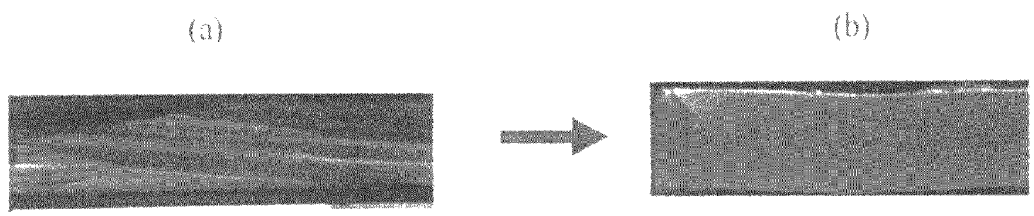
FIG. 4(a) is a DiamondView™ image of a single crystal CVD synthetic diamond material grown under high nitrogen/high substrate temperature conditions showing clearly visible striations.
FIG. 4(b) is a DiamondView™ image of a single crystal CVD synthetic diamond material grown under high nitrogen/high substrate temperature conditions with a large concentration of oxygen added to the synthesis atmosphere showing substantially no visible striations.

FIG. 4(a) is a DiamondView™ image of a single crystal CVD synthetic diamond material grown under high nitrogen/high substrate temperature conditions showing clearly visible striations. In this example the CVD synthesis atmosphere was formed using the following gas flow rate: 3000 sccm $H_2$; 0 sccm $CO_2$; 165 sccm $CH_4$; and 4.0 sccm pure $N_2$ (1254 ppm). These flow rates correspond to the following atomic concentrations: 97.5% H, 2.4% C; 0% 0; and 0.1% N.

In contrast, FIG. 4(b) is a DiamondView™ image of a single crystal CVD synthetic diamond material grown under high nitrogen/high substrate temperature/oxygen conditions showing substantially no visible striations. In this example the CVD synthesis atmosphere was formed using the following gas flow rate: 1000 sccm $H_2$; 500 sccm $CO_2$; 530 sccm $CH_4$; and 3 sccm $N_2$. These flow rates correspond to the following atomic concentrations: 67% H, 16.7% C, 16.2% 0; an 0.1% N.

FIG. 5 is a DiamondView™ image of a single crystal CVD synthetic diamond material comprising two layers including a first layer showing clearly visible striations which was grown using a CVD synthesis atmosphere as described above in relation to FIG. 4(a) and a second layer showing substantially no visible striations which was grown using a CVD synthesis atmosphere as described above in relation to FIG. 4(b).

Based on analysis of the DiamondView™ image using the freeware ImageJ program (http://rsbweb.nih.gov/ij/), it is possible to deduce a histogram of colour values for an image of a diamond sample, in order to ascertain its luminescence uniformity. The sample illustrated in FIG. 5 was analysed in such a manner (the {100} surface parallel to growth—alternatively, two {100} perpendicular surfaces can be analysed and the image with poorest uniformity can be taken as the surface of study). A DiamondView image was taken so that no region of the sample image was saturated, the aperture and field stop settings were set to 100%, the gain value was set to 0.00 dB (i.e. minimising noise), and the gamma enhancement setting was set to 'off' (i.e. a linear gamma curve). The image was loaded into ImageJ. The first stage of the analysis involved splitting the red, green and blue components of the image by selecting the 'Split Channels' command from the 'Color' submenu under the 'Image menu'. As the predominant colour of luminescence was red (owing to the fact that NV centers contributed most to the luminescence and these centres luminesce red/orange), it was considered most sensible to analyse the red image component and to reject the green and blue components. Next, from the red component, a selected rectangle was taken from each CVD layer, avoiding the sample surface, the substrate and any twinned or included regions that could influence the measurement. Note that this rectangle should be larger than 0.3 $mm^2$ or preferably larger than 0.6 $mm^2$ or more preferably larger than 1.0 $mm^2$. Clicking 'Analyse' and then 'Histogram' revealed the following histogram and the statistical parameters:

|  | Area ($mm^2$) | Mean | S.D. | Min | Max | Mode | S.D./mean (%) |
| --- | --- | --- | --- | --- | --- | --- | --- |
| HT/HN layer 1 | 1.7 +/− 0.2 | 97.569 | 18.117 | 48 | 164 | 94 | 18.6 |
| HT/HN/O layer 2 | 1.7 +/− 0.2 | 122.712 | 5.768 | 100 | 154 | 125 | 4.7 |

One can deduce the following from the above data: (i) the areas measured are very similar and both are representative of the sample face; (ii) the mean value for the HT/HN/O layer is higher than that of the HT/HN layer suggesting that O has the effect of increasing the strength of red luminescence (i.e. higher NV luminescence intensity); (iii) most pertinent to this invention, the standard deviation for the HT/HN/O layer is much smaller than for the HT/HN layer, as expected from FIG. 7; (iv) there is a far smaller spread in Min and Max values for the HT/HN/O layer than for the HT/HN layer, consistent with (iii); and (v) the mode of the HT/HN/O layer is higher than for the HT/HN layer, consistent with (ii).

From this analysis, we can say that improved luminescence uniformity by employing either a heavy O-doped chemistry or by reducing methane is characterised by a variation in red luminescence intensity, as defined by the standard deviation divided by the mean in the manner described above, of less than 15% or preferably less than 10% or more preferably less than 8% or more preferably less than 6% or more preferably less than 4%.

Figure 6:
FIG. 6 is a DiamondView™ image of a single crystal CVD synthetic diamond material comprising two layers including a first layer showing clearly visible striations which was grown under high nitrogen/high substrate temperature conditions and a second layer showing substantially no visible striations which was formed by reducing the concentration of methane in the synthesis atmosphere.

FIG. 6 is a DiamondView™ image of a single crystal CVD synthetic diamond material comprising two layers including a first layer showing clearly visible striations which was grown under high nitrogen/high substrate temperature conditions and a second layer showing substantially no visible striations which was formed by reducing the concentration of methane in the synthesis atmosphere. For the first layer the CVD synthesis atmosphere was formed using the following gas flow rate: 3000 sccm $H_2$; 20 sccm Ar; 165 sccm $CH_4$; and 4 sccm $N_2$. These flow rates correspond to the following atomic concentrations: 2.4% C; and 0.1% N. For the second layer the CVD synthesis atmosphere was formed using the following gas flow rate: 3000 sccm $H_2$; 20 sccm Ar; 45 sccm $CH_4$; and 4 sccm $N_2$. These flow rates correspond to the following atomic concentrations: 0.7% C; and 0.1% N.

Figure 7:
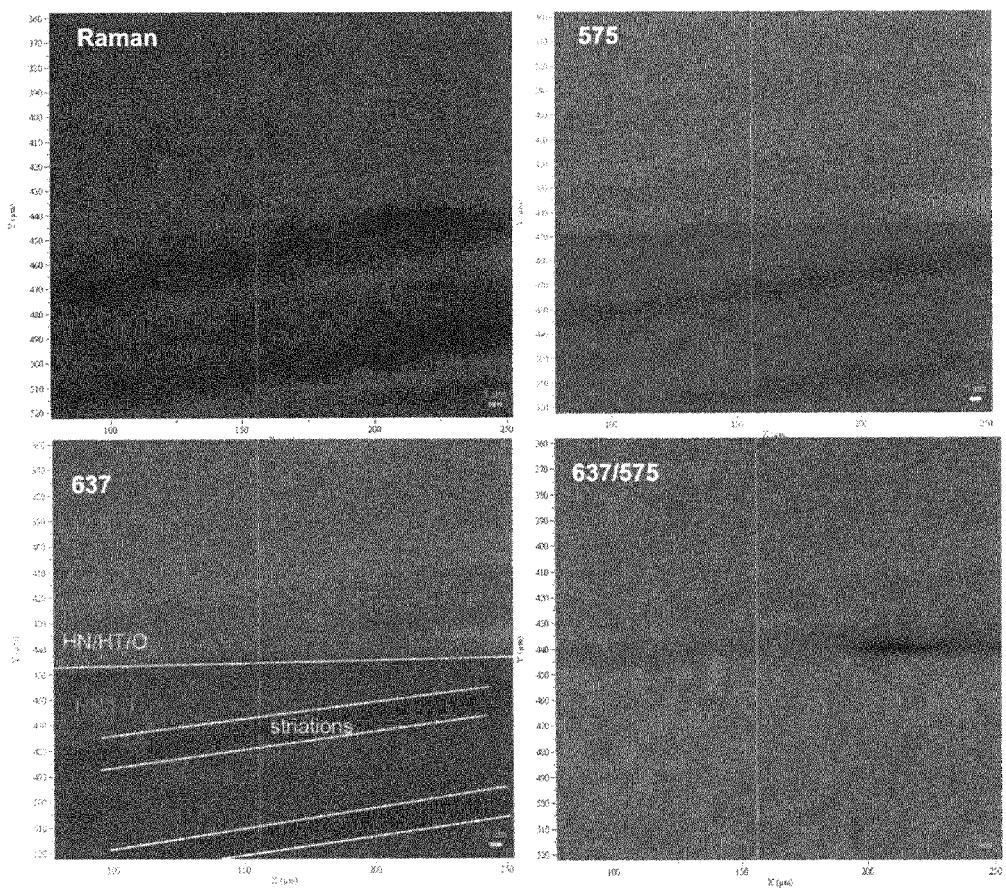
FIG. 7 shows photoluminescence maps (514 nm excitation) for the two layer single crystal CVD synthetic diamond material shown in FIG. 5 including a first layer showing clearly visible striations which was grown under high nitrogen/high substrate temperature conditions and a second layer showing substantially no visible striations which was formed by adding a large concentration of oxygen to the synthesis atmosphere.

FIG. 7 shows photoluminescence (PL) maps for the two layer single crystal CVD synthetic diamond material shown in FIG. 5. These photoluminescence maps were taken using 50 mW continuous-wave laser excitation at 514 nm (Ar laser) with the sample held at room temperature. A laser spot size of less than 10 µm diameter, more preferably less than 5 µm diameter, is utilized. A 600 lines/mm grating was used, giving a spectral resolution of about 0.1 nm. The grating was positioned so that spectral data from 550-650 nm could be collected. The laser was raster-scanned over a 250 µm×250 µm region of a polished surface of the sample that was parallel to the <100> growth direction. In practice, a raster scan >50 µm×50 µm would be sufficient. The step increment was 5 µm. In order to calculate the line intensities at room temperature, the following method was applied. First, each peak was baselined using a polynomial fit to the baseline region. The Raman peak at 552.4 nm was sharp, and therefore a baseline window of 551-554 nm was sufficient. The 575 and 637 nm features were far broader, and therefore baselining windows of 570-582 nm (575 nm peak) and 630-645 nm (637 nm peak) were required. Then, before analysis of each peak, the spectrum was converted from nm on the x-scale to eV. Then, for each peak, an integrated area was deduced by fitting to each of the peaks using a mixed Gaussian/Lorentzian non-linear least squares algorithm. The resulting peak area is in eV counts per second (cps). This procedure was followed for the diamond Raman at 552.4 nm, the 575 nm feature and the 637 nm feature. This was performed for the regions of lowest and highest 575 and 637 nm line intensity in each of the layers. Normalised 535 and 637 nm line area values were calculated by dividing the 575 and 637 areas by the area of the diamond Raman line. The values are shown in the following table:

|  | Layer 1 (HT/HN) | | Layer 2 (HT/HN/O) | |
| --- | --- | --- | --- | --- |
|  | lowest | highest | lowest | highest |
| Raman area (cps.eV) | 17.77 | 13.45 | 18.79 | 17.23 |
| 575 nm area (cps.eV) | 187.96 | 307.65 | 419.09 | 636.31 |
| 637 nm area (cps.eV) | 493.69 | 838.44 | 1051.1 | 1721.3 |

-continued

|  | Layer 1 (HT/HN) | | Layer 2 (HT/HN/O) | |
| --- | --- | --- | --- | --- |
|  | lowest | highest | lowest | highest |
| 575 nm/R ratio | 10.99 | 22.87 | 22.30 | 36.93 |
| 637 nm/R ratio | 28.85 | 62.34 | 55.93 | 99.88 |
| highest/lowest (Raman) | 1.27 | | 1.09 | |
| highest/lowest (575 nm) | 2.08 | | 1.66 | |
| highest/lowest (637 nm) | 2.16 | | 1.79 | |

From this table it is clear that the integrated area of the diamond Raman feature varies by approximately 1.3× between regions of low PL intensity and high PL intensity in the standard HT/HN-grown layer, but only by approximately 1.1× in the HT/HN/O-grown layer. We note that these values are the minimum and maximum Raman values measured over the sample surface—the region of lowest Raman intensity was observed to correspond directly to the region of highest 575 and 637 nm PL, and vice versa. Therefore, certain embodiments of the present invention can be demonstrated if integrated area ratio of the diamond Raman feature over the sample area measured in this manner is <1.25 or preferably <1.20 or more preferably <1.15 or more preferably <1.10 or more preferably <1.05.

From this table it is also clear that for both the 575 and 637 nm features in the HT/HN-grown layer there is a variation of greater than 2× between regions of low intensity and regions of high intensity, whilst in the HT/HN/O-grown layer, the variation is less than 2×. Therefore, certain embodiments of the present invention can be demonstrated if the normalised 575 or 637 luminescence intensity ratio between regions of high PL intensity and regions of low PL intensity are <2 or preferably <1.8 or more preferably <1.6 or more preferably <1.4 or more preferably <1.2.

It is also noted that the PL line intensity values are greater for layer 2 than for layer 1. Although there is some overlap, we can say that, for room temperature PL measurements, 575 nm/R values greater than 30 and/or 637 nm/R values greater than 70 characterise certain embodiments of the present invention.

PL at 77K (liquid nitrogen temperature) can also be used to further investigate the 575 and 637 nm lines. On the same sample, PL was performed at 77K using the same setup and 514 nm excitation. At 77K both the 575 and 637 nm PL lines sharpen considerably and increase in intensity. The sample was cooled using a standard cryostat and sufficient delay was allowed for the sample to reach 77K (the temperature was measured close to the sample using a thermocouple). Then the spectrum between 520 and 850 nm was taken. In order to calculate the line intensities at 77K, the following method was applied. First, each peak was baselined using a polynomial fit to the baseline region. As the Raman and PL peaks were sharp and the baseline was close to zero, this was not problematic. Then, before analysis, the spectrum was converted from nm on the x-scale to eV. Then, for each peak, an integrated area was deduced by fitting to each of the peaks using a mixed Gaussian/Lorentzian non-linear least squares algorithm. The resulting peak area is in eV counts per second (cps). This was done for the diamond Raman at 552.4 nm, the 575 nm feature and the 637 nm feature. The normalised PL line intensities for two spots taken on the sample, one for the HT/HN layer and the other for the HT/HN/O layer, are shown below:

|  | Layer 1 (HT/HN) | Layer 2 (HT/HN/O) |
| --- | --- | --- |
| 575 nm/R area ratio | 85.90 | 144.66 |
| 637 nm/R area ratio | 167.69 | 223.80 |

Although it is clear from that there is considerable spread in the 575 and 637 line area ratios for layer 1, is has been noted that the values are larger for layer 2 than for layer 1. This is also observed in the DiamondView images (e.g. as shown in FIGS. 5 and 6). The 77K results also appear to support the room-temperature results already shown. Thus we can say that, for 77K PL measurements, 575 nm/R values greater than 120 and/or 637 nm/R values greater than 200 characterise certain embodiments of the present invention.

As-grown NV defects such as those discussed above can straightforwardly be distinguished from those which are at least in part formed by irradiation and annealing as CVD synthetic diamond material treated in such a way shows features present in the UV-visible, IR or PL spectra that are not present in as-grown CVD synthetic diamond. These include: the 594 nm feature in UV-visible absorption; the 1450 $cm^{-1}$ feature in IR spectra; and features such as the 470 nm and 550.8 nm features in PL. Furthermore, as-grown nitrogen defects can be distinguished over implanted nitrogen due to: (i) the absence of implantation damage; and (ii) the nitrogen defects are distributed throughout the diamond material, or a layer of material grown as described herein, rather than in a near surface plane formed by implantation. As such, in accordance with the present invention nitrogen defects are distributed uniformly when analysed in two orthogonal planes.

Figure 8:
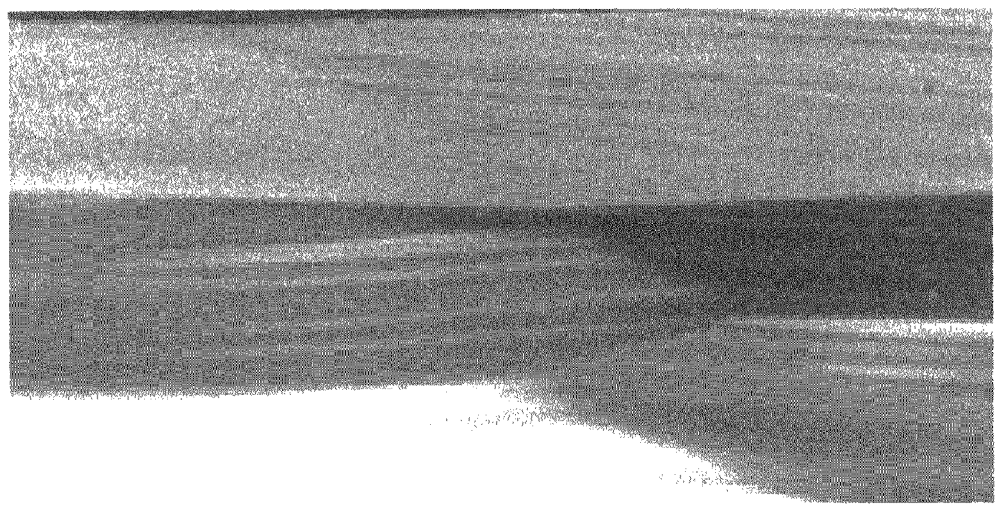
FIG. 8 shows a microscopy image for a two-layer single crystal CVD synthetic diamond material comprising two layers including a first layer showing clearly visible non-uniformity which was grown under high nitrogen/high substrate temperature conditions and a second layer showing substantially better colour uniformity which was achieved by adding a large concentration of oxygen to the synthesis atmosphere.

FIG. 8 is a microscopy image of a single crystal CVD synthetic diamond material comprising two layers including a first layer showing clearly visible colour non-uniformity which was grown under high nitrogen/high substrate temperature conditions and a second layer showing substantially improved colour uniformity which was formed by adding oxygen to the synthesis atmosphere. For the first layer the CVD synthesis atmosphere was formed using the following gas flow rate: 3000 sccm $H_2$; 165 sccm $CH_4$; and 40 sccm of a 10% $N_2$: $H_2$ mix. These flow rates correspond to the following atomic concentrations: 2.4% C; and 0.1% N. For the second layer the CVD synthesis atmosphere was formed using the following gas flow rate: 380 sccm $H_2$; 530 sccm $CH_4$; 470 sccm $CO_2$, and 10 sccm of a 10% $N_2$: $H_2$ mix. These flow rates correspond to the following atomic concentrations: 20.7% C, 19.5% 0; and 0.04% N.

In a similar manner to the analysis of the DiamondView image (shown in FIG. 5), based on analysis of the microscopy image using the freeware ImageJ program (http://rsbweb.nih.gov/ij/), it was possible to deduce a histogram giving the distribution of gray values for an image of a diamond sample, in order to ascertain its uniformity in colour. The sample shown in FIG. 8 was analysed in such a manner (the {100} surface parallel to growth—alternatively, two {100} perpendicular surfaces can be analysed and the image with poorest uniformity can be taken as the surface of interest). The original microscopy image was taken with the growth features in sharp focus using a CCD camera of more than 2 megapixels, and a magnification chosen such that the longest length axis of the sample occupied at least 50% of the image width. The image acquisition conditions were taken so that the background was saturated, but no region of the sample was saturated, and a gamma setting of 0.5, thus ensuring good contrast and brightness. The image was loaded into ImageJ. For analysis, the largest selection rectangle possible was taken from each CVD layer, avoiding the sample surface, the substrate and any twinned or included regions that could influence the measurement. Note that this rectangle should be larger than 0.3 $mm^2$ or preferably larger than 0.4 $mm^2$ or more preferably larger than 0.5 $mm^2$. Clicking 'Analyse' and then 'Histogram' revealed the histogram and the statistical parameters:

|  | Area ($mm^2$) | Mean | S.D. | Min | Max | Mode | S.D./mean (%) |
| --- | --- | --- | --- | --- | --- | --- | --- |
| HT/HN layer | 0.97 | 140.54 | 64.613 | 46 | 239 | 223 | 42.9 |
| HT/HN/O layer | 0.77 | 120.27 | 7.593 | 73 | 151 | 119 | 6.3 |

One can make a number of deductions from the above data: (i) although the area measured in the HT/HN layer was greater than the area measured in the HT/HN/O layer (the former was thicker so this was possible), both areas are of a similar order and encompass a reasonable area of the sample face; (ii) the mean gray value for the HT/HN layer is higher than that of the HT/HN/O layer suggesting that overall, oxygen appears to have the effect of improving colour; (iii) most pertinent to this invention, the standard deviation is much smaller for the HT/HN/O layer than for the HT/HN layer, as expected from FIG. 8; (iv) there is a far greater spread in Min and Max gray values for the HT/HN layer than for the HT/HN/O layer, consistent with (iii); and (v) the mode of the HT/HN layer is higher than for the HT/HN/O layer, consistent with (ii). From this analysis, we can say that improved colour uniformity by employing either a heavy O-doped chemistry or by reducing methane is characterised by a variation in gray colour, as characterised by the gray value standard deviation divided by the gray value mean, of less than 50%, 40% 30%, 20%, 10% or 5%.

A microscope attached to a Nicolet Magna-IR 750 Fourier-transform infrared (FTIR) spectrometer was used in order to measure the nitrogen concentration and the nitrogen uniformity in the HT/HN and HT/HN/O grown layers for the sample shown in FIG. 8. Again, a {100} surface parallel to the growth direction was studied. A representative sample of five spots was measured for each layer. By a representative sample, we mean that 5 spots were measured to give as good an indication of the spectral characteristics of each layer, whilst avoiding the following features which may lead to erroneous results: (a) twinned growth; (b) the sample substrate; and (c) the sample surface. In practice, more spots could be measured but 5 points in each layer is a good lower limit. The sizes of the apertures used were 1.5 mm for the upper aperture and 1 mm for the lower aperture. The spectrometer was set up for acquisition using 512 scans between 650 and 4000 $cm^{-1}$ with a spectral resolution (as defined by the instrument settings) of 2 $cm^{-1}$. Before data acquisition, a background spectrum was acquired and the background spectra were subtracted from the sample spectra. Following acquisition of the sample spectra, the IR spectrum of water vapour was subtracted from the sample spectra. Then, the spectra were normalised by dividing with the spectrum of a standard type IIa natural diamond of known thickness to give absorption coefficient values in terms of $cm^{-1}$.

It is well known (e.g. S. C. Lawson, D, Fisher et al. J. Phys.: Condens. Matter 10 6171-6180 (1998)) that the intensity of the IR feature at 1344 cm$^{-1}$ may be used for deducing the neutral single substitutional nitrogen concentration ([N$_s^0$]). By fitting to the area of the feature at 1344 cm$^{-1}$ and multiplying by a factor of 14.70, [N$_s^0$] values were deduced for 5 representative points in the HT/HN layer, and for 5 representative points in the HT/HN/O layer. The multiplication factor has been determined previously and been found to give an accurate value for deducing [N$_s^0$] over a wide range of diamond samples. Mean and standard deviations of [N$_s^0$] were deduced for each layer. The Table below shows the values that were obtained:

|  | [N$_s^0$] (ppm) | Mean [N$_s^0$] (ppm) | S.D. (ppm) | S.D./MEAN (%) |
| --- | --- | --- | --- | --- |
| HT/HN point 1 | 13.7 | 11.4 | 11.2 | 98.0 |
| HT/HN point 2 | 18.4 | | | |
| HT/HN point 3 | 25.1 | | | |
| HT/HN point 4 | 0.0 | | | |
| HT/HN point 5 | 0.0 | | | |
| HT/HN/O point 1 | 21.2 | 19.9 | 2.9 | 14.5 |
| HT/HN/O point 2 | 21.2 | | | |
| HT/HN/O point 3 | 19.1 | | | |
| HT/HN/O point 4 | 22.8 | | | |
| HT/HN/O point 5 | 15.3 | | | |

Several points can be observed from the above table: (i) the mean [N$_s^0$] is higher for the HT/HN/O layer than the HT/HN layer, suggesting that is likely to be of benefit for increasing the concentration of nitrogen within the material, which is useful for certain applications; And (ii) the standard deviation of N$_s^0$ is significantly greater for the HT/HN layer than for the HT/HN/O layer, indicating greatly improved nitrogen uniformity in the HT/HN/O layer. To summarise, the HT/HN/O layer is characterised by a variation in neutral single substitutional nitrogen concentration (as measured over as wide an area of the sample as possible but using at least 5 spots sampling an area greater than an area of 0.5 mm$^2$, using the 1344 cm$^{-1}$ feature in IR spectra) of lower than 80% or preferably lower than 60% or more preferably lower than 40% or more preferably lower than 20% or more preferably lower than 10%, the variation deduced by dividing the standard deviation by the mean.

In addition to the above, secondary ion mass spectroscopy (SIMS) mapping may be performed in order to determine variations in the total nitrogen concentration within a sample. First, the N signal is calibrated using a reference diamond sample of known nitrogen concentration. Then, in order to define the analysis area, an aperture is placed in front of a rastered SIMS beam (which is typically 15 keV $^{18}$O$_2^+$). For the purposes of this study, a 10×10 micron aperture is used. This translates to a N concentration sensitivity in the order of a few parts per million (greater sensitivities may be employed by using larger apertures). This aperture is then mapped over the sample point-by-point. At each point, the beam is applied for typically 10 minutes in order to collect data typically 2 microns within the diamond sample, this minimising the contribution from atmospheric contamination. In this manner, over several hours, a 5×5 map will allow a 50×50 micron region of the sample to be sampled.

Samples can also be treated by way of irradiation and/or annealing. For example, HPHT treated samples still have an N$_s$ concentration and distribution within the previously discussed limits although the 50 ppb NV limit may no longer apply as NV defects can be at least partially annealed out of the material. Colour and luminescence will remain uniform. Depending on the specific starting material and the HPHT treatment the colour of treated samples may be colourless, yellow, or grey. Having regard to luminescence, this will no longer tend to be a characteristics red/orange NV luminescence but rather a green luminescence or blue-green luminescence. Spectroscopic features that (i) come up on annealing and (ii) are CVD specific include: 524.3 nm in PL, 1341 cm$^{-1}$ in IR; and 451/454 nm in 77K UV-Vis absorption. Multiple annealing and/or irradiation steps can be performed to achieve specific target colours. For example, a triple treatment comprising annealing, irradiating, and annealing can be applied to a material of the present invention. Such a triple treatment can be used to achieve a pink colouration. Again, such treated samples still have an N$_s$ concentration and distribution within the previously discussed limits. Uniformity in terms of colour and luminescence is also retained. Triple-treatment features include the above annealing-related CVD features plus a 594 nm feature in 77K UV-vis absorption and a 1450 cm$^{-1}$ feature in IR (as well as strong 575/637 nm luminescence from NV defects).

These examples illustrate the improvements in material quality achieved by embodiments of the present invention. However, while the invention has been particularly shown and described with reference to preferred embodiments, it will be understood to those skilled in the art that various changes in form and detail may be made without departing from the scope of the invention as defined by the appending claims.

The invention claimed is:

1. A single crystal CVD synthetic diamond material comprising:
  a total as-grown nitrogen concentration equal to or greater than 5 ppm, and
  a uniform distribution of defects, wherein said single crystal CVD synthetic diamond material is free of visible striations under photoluminescent conditions, and wherein said uniform distribution of defects is defined by one or more of the following characteristics:
  (i) the total nitrogen concentration, when mapped by secondary ion mass spectrometry (SIMS) over an area equal to or greater than 50×50 µm using analysis area of 10 µm or less, possesses a point-to-point variation of less than 30% of an average total nitrogen concentration value, or when mapped by SIMS over an area equal to or greater than 200×200µm using an analysis area of 60 µm or less, possesses a point-to-point variation of less than 30% of an average total nitrogen concentration value;
  (ii) an as-grown nitrogen-vacancy defect (NV) concentration equal to or greater than 50 ppb as measured using 77K UV-visible absorption measurements, wherein the nitrogen-vacancy defects are uniformly distributed through the synthetic single crystal CVD diamond material such that, when excited using a 514 nm laser excitation source of spot size equal to or less than 10 µm at room temperature using a 50 mW continuous wave laser, and mapped over an area equal to or greater than 50×50µm with a data interval less than 10 µm, there is a low point-to-point variation wherein the intensity area ratio of nitrogen vacancy photoluminescence peaks between regions of high photoluminescent intensity and regions of low photolominescent intensity is <2x for either the 575 nm photoluminescent peak(NV$^0$) or the 637 nm photoluminescent peak (NV$^-$);
  (iii) a variation in Raman intensity such that, when excited using a 514 nm laser excitation source (resulting in a Raman peak at 552.4 nm) of spot size equal to or less than 10 µm at room temperature using a 50 mW continuous wave laser, and mapped over an area equal to or greater than 50×50µm with a data interval less than 10

μm, there is a low point-to-point variation wherein the ratio of Raman peak areas between regions of low Raman intensity and high Raman intensity is <1.25x;

(iv) an as-grown nitrogen-vacancy defect (NV) concentration equal to or greater than 50 ppb as measured using 77K UV-visible absorption measurements, wherein, when excited using a 514 nm excitation source of spot size equal to or less than 10 μm at 77K using a 50 mW continuous wave laser, gives an intensity at 575 nm corresponding to $NV^0$ greater than 120 times a Raman intensity at 552.4 nm, and/or an intensity at 637 nm corresponding to $NV^-$ greater than 200 times the Raman intensity at 552.4 nm;

(v) a single substitutional nitrogen defect ($N_s$) concentration equal to or greater than 5 ppm, wherein the single substitutional nitrogen defects are uniformly distributed through the synthetic single crystal CVD diamond material such that by using a 1344 $cm^{-1}$ infrared absorption feature and sampling an area greater than an area of 0.5 $mm^2$, the variation is lower than 80%, as deduced by dividing the standard deviation by the mean value;

(vi) a variation in red luminescence intensity, as defined by a standard deviation divided by a mean value, is less than 15%;

(vii) a mean standard deviation in neutral single substitutional nitrogen concentration of less than 80%; and (viii) a colour intensity as measured using a histogram from a microscopy image with a mean gray value of greater than 50, wherein the colour intensity is uniform through the single crystal CVD synthetic diamond material such that the variation in gray colour, as characterised by the gray value standard deviation divided by the gray value mean, is less than 40%.

2. A single crystal CVD synthetic diamond material according to claim 1, wherein the single crystal CVD synthetic diamond material comprises two, three, four, five, six, seven or all eight of said characteristics.

3. A single crystal CVD synthetic diamond material according to claim 1, wherein the total nitrogen concentration, when mapped by secondary ion mass spectrometry (SIMS) over an area equal to or greater than 50–50μm with an analysis area defined as 10 μm or less, possesses a point-to-point variation of less than 25% of an average nitrogen concentration value.

4. A single crystal CVD synthetic diamond material according to claim 1, wherein the luminescence from the nitrogen-vacancy defects, when mapped over an area equal to or greater than 50–50μm with an analysis area defined as 10 μm or less, possesses a point-to-point variation such that the intensity ratio between regions of high PL intensity and regions of low PL intensity is less than 1.8.

5. A single crystal CVD synthetic diamond material according to claim 1, wherein the $NV^0$ luminescence at 575 nm is greater than 140 times the Raman intensity at 552.4 nm, and/or the NV luminescence at 637 nm is greater than 220 times the Raman intensity at 552.4 nm.

6. A single crystal CVD synthetic diamond material according to claim 1, the single substitutional nitrogen defects are uniformly distributed through the synthetic single crystal CVD diamond material such that by using the 1344 $cm^{-1}$ infrared absorption feature from the single substitutional nitrogen defects and sampling an area greater than an area of 0.5 $mm^2$ the variation is lower than 60% as deduced by dividing the standard deviation by the mean.

7. A single crystal CVD synthetic diamond material according to claim 1, wherein the variation in red luminescence is less than 10%.

8. A single crystal CVD synthetic diamond material according to claim 1, wherein the mean standard deviation in neutral single substitutional nitrogen concentration is less than 60%.

9. A single crystal CVD synthetic diamond material according to claim 1, wherein the colour intensity, when imaged over volume equal to or greater than 200×200×200 μm, possesses a point-to-point variation of less than 30% of an average colour intensity, as defined by the gray value standard deviation divided by the gray value mean.

10. A single crystal CVD synthetic diamond material according to claim 1, wherein the total nitrogen concentration is equal to or greater than 7 ppm.

11. A single crystal CVD synthetic diamond material according to claim 1, wherein the single substitutional nitrogen defect ($N_s$) concentration is equal to or greater than 7 ppm.

12. A single crystal CVD synthetic diamond material according to claim 1, wherein the as-grown nitrogen-vacancy defect ($NV^-$) concentration is equal to or greater than 120 ppb.

13. A single crystal CVD synthetic diamond material according to claim 1, having a concentration of silicon equal to or less than $1 \times 10^{15}$ atoms $cm^{-3}$.

14. A single crystal CVD synthetic diamond material according to claim 1, wherein the single crystal CVD synthetic diamond material has a longest dimensions equal to or greater than 200 μm.

15. A single crystal CVD synthetic diamond material according to claim 1, having a volume equal to or greater than 0.01 $mm^3$ though which said one or more characteristics hold true.

16. A single crystal CVD synthetic diamond material according to claim 1, wherein the single crystal CVD synthetic diamond material is in the form of a layer having a thickness less than 200 μm.

17. A single crystal CVD synthetic diamond material according to claim 1, wherein the single crystal CVD synthetic diamond material is in the form of a layer having a thickness greater than 200 μm.

18. A single crystal CVD synthetic diamond material according to claim 1, having a dislocation bundle density equal to or less than: $10^6$ dislocations $cm^{-2}$.

19. A single crystal CVD synthetic diamond material according to claim 1, having a birefringence equal to or less than $5 \times 10^{-5}$.

20. A single crystal CVD synthetic diamond material according to claim 1, which has been annealed and/or irradiated.

21. A single crystal CVD synthetic diamond material according to claim 1, wherein the single crystal CVD synthetic diamond material has one or more of the following colours: pink, yellow, green, orange, red, purple.

* * * * *